(12) United States Patent
Lee et al.

(10) Patent No.: US 11,018,037 B2
(45) Date of Patent: *May 25, 2021

(54) OPTICAL RETICLE LOAD PORT

(71) Applicant: Taiwan Semiconductor Manufacturing Company, Ltd., Hsinchu (TW)

(72) Inventors: Yu-Ching Lee, Kaohsiung (TW); Yu-Piao Fang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/675,473

(22) Filed: Nov. 6, 2019

(65) Prior Publication Data

US 2020/0075373 A1 Mar. 5, 2020

Related U.S. Application Data

(63) Continuation of application No. 15/665,125, filed on Jul. 31, 2017, now Pat. No. 10,503,082.

(51) Int. Cl.
*H01L 21/673* (2006.01)
*G03F 1/66* (2012.01)
*H01L 21/677* (2006.01)

(52) U.S. Cl.
CPC .......... *H01L 21/67359* (2013.01); *G03F 1/66* (2013.01); *H01L 21/6773* (2013.01); *H01L 21/67373* (2013.01)

(58) Field of Classification Search
USPC .......................................................... 355/75
See application file for complete search history.

(56) References Cited

U.S. PATENT DOCUMENTS

| | | | |
|---|---|---|---|
| 4,724,874 | A | 2/1988 | Parikh et al. |
| 4,815,912 | A | 3/1989 | Maney et al. |
| 5,314,068 | A | 5/1994 | Nakazato et al. |
| 5,740,845 | A | 4/1998 | Bonora et al. |
| 6,216,873 | B1 | 4/2001 | Fosnight et al. |
| 6,338,409 | B1 | 1/2002 | Neary |
| 6,813,005 | B2 | 11/2004 | Guo |

(Continued)

FOREIGN PATENT DOCUMENTS

| | | |
|---|---|---|
| JP | 2015081947 A | 4/2014 |
| KR | 20040065586 A | 7/2004 |

(Continued)

*Primary Examiner* — Rodney E Fuller
(74) *Attorney, Agent, or Firm* — Slater Matsil, LLP

(57) ABSTRACT

An apparatus configured to load or unload a mask pod includes a first load port supporter and a second load port supporter spaced apart from the first load port supporter. Each of the first load port supporter and the second load port supporter includes at least portions of an L-shaped rectangular prism. The first load port supporter and the second load port supporter are disposed diagonally around a rectangular area, where first inner sidewalls of the first load port supporter and second inner sidewalls of the second load port supporter delimit boundaries of the rectangular area, and where a first width of the rectangular area is equal to a second width of the mask pod, and a first length of the rectangular area is equal to a second length of the mask pod.

20 Claims, 24 Drawing Sheets

(56) References Cited

U.S. PATENT DOCUMENTS

| | | |
|---|---|---|
| 7,581,372 B2 | 9/2009 | Durben et al. |
| 7,930,061 B2 | 4/2011 | Rice et al. |
| 10,503,082 B2 * | 12/2019 | Lee .................... G03F 7/70733 |
| 2004/0005209 A1 | 1/2004 | Su et al. |
| 2004/0164256 A1 | 8/2004 | Fan |
| 2006/0177287 A1 | 8/2006 | Wu et al. |
| 2008/0071417 A1 | 3/2008 | Rice et al. |
| 2010/0054897 A1 | 3/2010 | Bufano et al. |
| 2015/0166227 A1 | 6/2015 | Kuratsu |

FOREIGN PATENT DOCUMENTS

| | | |
|---|---|---|
| KR | 20040100294 A | 12/2004 |
| KR | 20060081932 A | 7/2006 |
| KR | 20070080518 A | 8/2007 |

\* cited by examiner

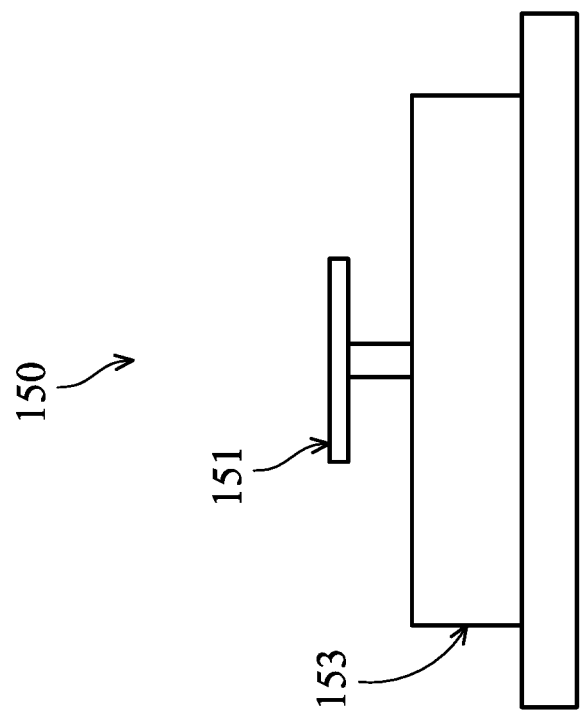
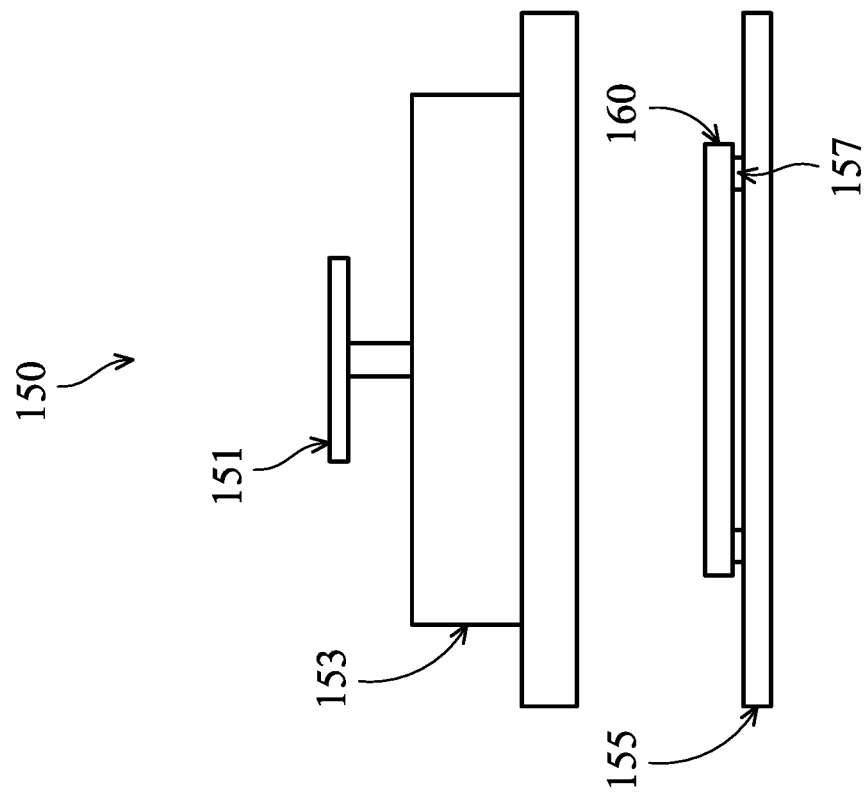

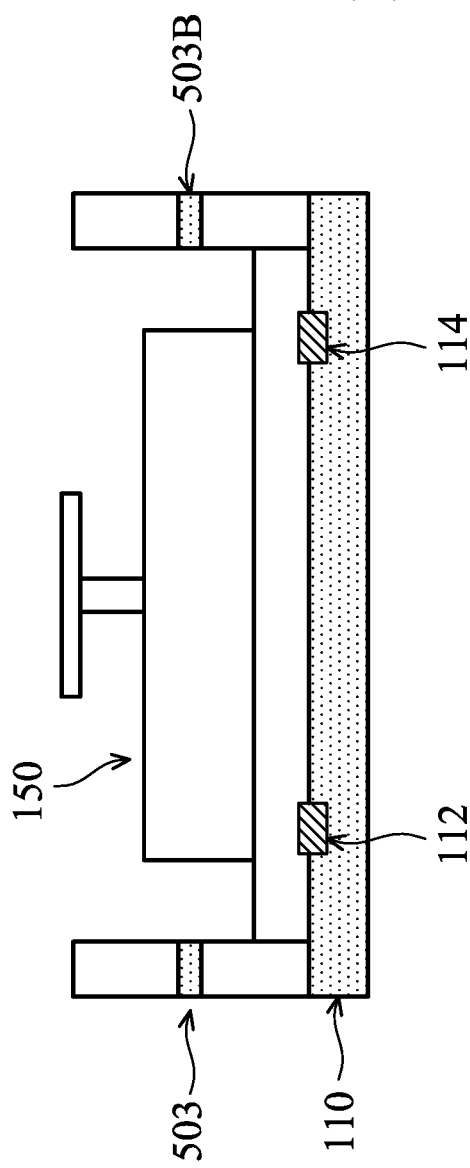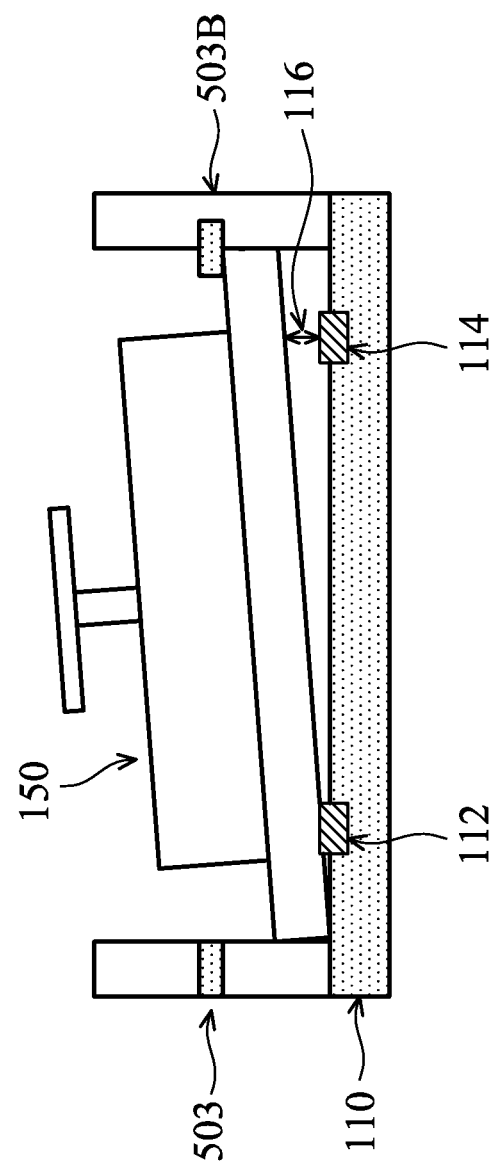

OPTICAL RETICLE LOAD PORT

PRIORITY CLAIM AND CROSS-REFERENCE

This application is a continuation of U.S. patent application Ser. No. 15/665,125, filed on Jul. 31, 2017, and entitled "Optical Reticle Load Port," which application is incorporated herein by reference in its entirety.

BACKGROUND

Photolithography generally refers to an optical process used to transfer geometric patterns onto a substrate or a layer over a substrate. Many photolithography techniques use a light-sensitive material (commonly referred to as a "photoresist") to create geometric patterns. For example, a photomask, or a reticle, may be disposed over the photoresist, which may then be exposed to a radiation beam such as ultraviolet (UV) or an excimer laser. A bake or cure operation may be performed to harden the photoresist, and a developer may be used to remove either the exposed or unexposed portions of the photoresist depending on whether a positive or negative resist is used. Thus, a pattern corresponding to the pattern of the reticle is formed in the photoresist, which may be used as a mask layer to transfer the pattern to an underlying layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B illustrate a mask pod in an open state and in a closed state, respectively, in accordance with some embodiments.

FIGS. 19A and 19B are cross-sectional views illustrating a method for detecting an abnormal condition of the mask pod using a smart load port, in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the present disclosure, unless otherwise specified, similar numbers are used to describe similar parts.

Embodiments of the present disclosure are discussed in the context of load port design and removing of a mask pod from the load port. Disclosed embodiments include load port supporters that are attached to a load port, or are used standalone. Sensors and locking devices are embedded in the disclosed load ports. Based on the outputs of the sensors, a control unit detects abnormal conditions of the mask pod, and activates the locking devices to limit the movement of the mask pod and to prevent damage to the reticle carried by the mask pod.

Figure 1A:
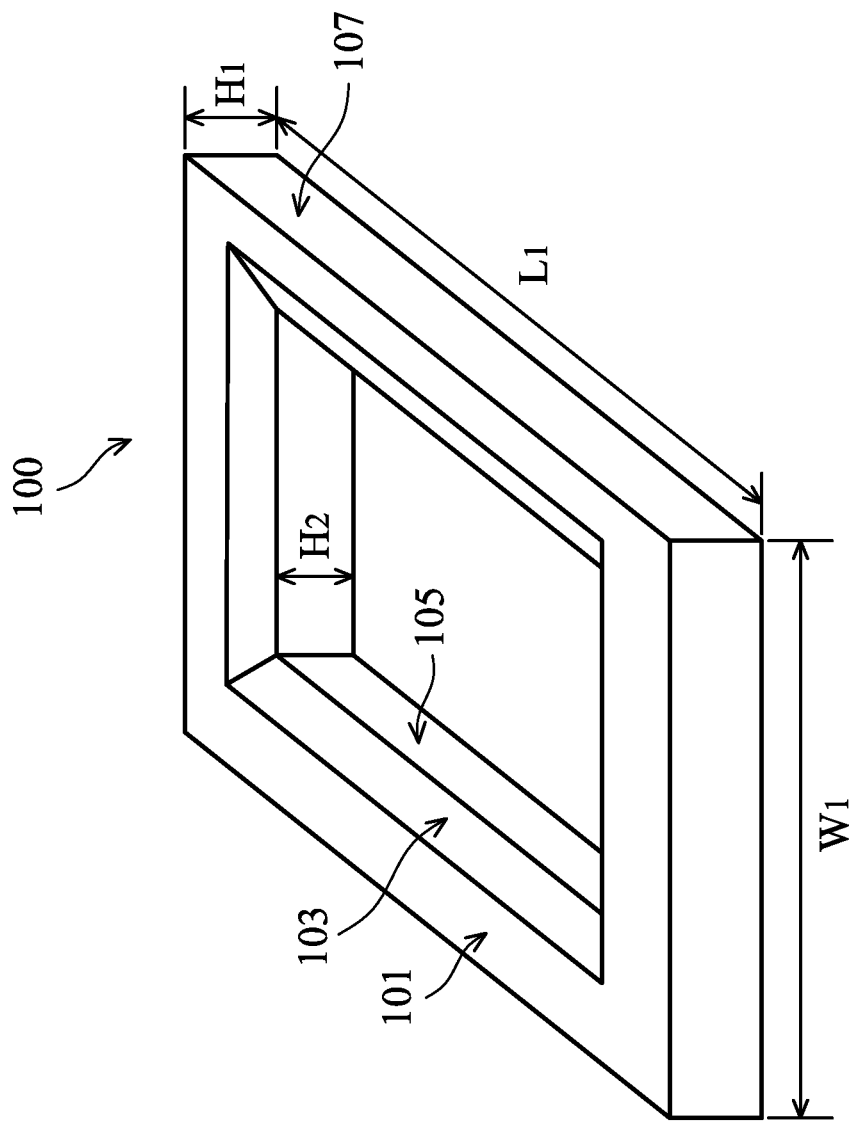
FIGS. 1A and 1B illustrate a perspective view and a plan view of a load port, respectively, in accordance with some embodiments.

FIG. 1A illustrates a perspective view of a load port 100 for loading and unloading reticles (not shown) used in a photolithography tool for semiconductor manufacturing. As illustrated in FIG. 1A, the load port 100 has a shape of a rectangular ring with chamfers 103, which chamfers 103 are between an upper surface 101 of the load port 100 and interior sidewalls 105 of the load port 100. The chamfers 103 may also be referred to as beveled edges in the present disclosure.

The load port 100 is made of a rigid material, such as steel, or aluminum titanium alloy, to maintain a pre-determined dimension that matches a dimension of a mask pod that will be loaded into the load port 100. The surfaces of the load port 100 may be coated with a coating material to provide resistance to scratching. The coating material may comprise chromium, or tungsten. For example, the coating material may reduce or prevent particles of the material of the load port 100 from being scraped off (e.g., by the mask pod during loading and unloading) and contaminate the reticles carried in the mask pod.

In some embodiment, a width $W_1$ of the load port 100 is in the range of about 235 mm to about 255 mm. A length $L_1$ of the load port 100 may be in the range of about 255 mm to 465 mm. A height $H_1$ of exterior sidewalls 107 is in the range of about 15 mm to about 25 mm, and a height $H_2$ of the interior sidewalls 105 is in the range of about 10 mm to 15 mm, in some embodiments.

Figure 1B:
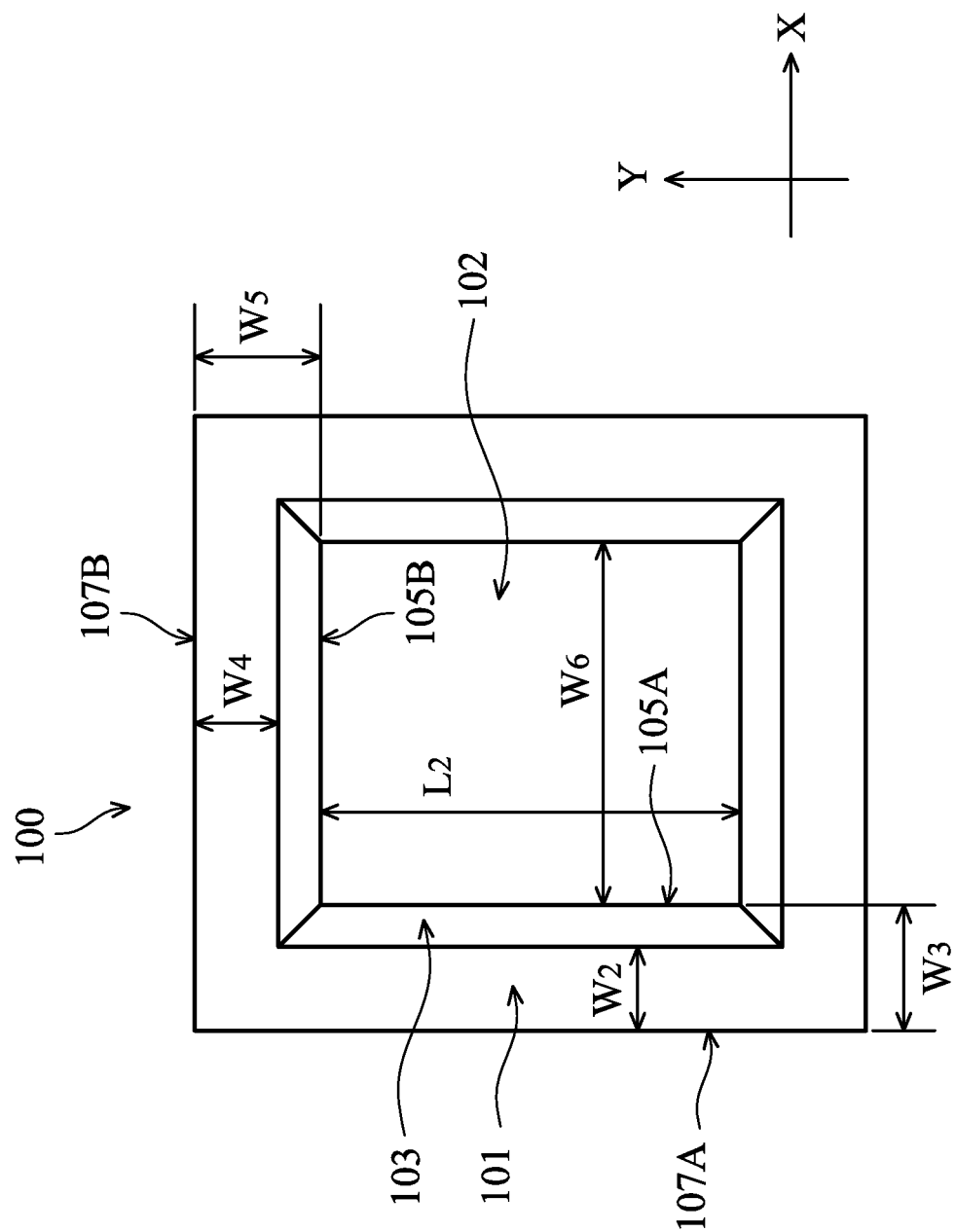

FIG. 1B illustrates a plan view of the load port 100 of FIG. 1A. An opening 102 is in the middle of the load port 100. In the illustrated embodiment, the upper surface 101 of the load port 100 has a width $W_2$ measured along the X-direction, and a width $W_4$ measured along the Y-direction. In addition, an exterior sidewall 107A and a corresponding interior sidewall 105A have a distance $W_3$ measured along the X-direction. Furthermore, an exterior sidewall 107B and a corresponding interior sidewall 105B have a distance $W_5$ measured along the Y-direction.

In some embodiments, the width $W_2$ is in a range from about 5 mm to about 70 mm, and the width $W_4$ is in a range from about 50 mm to about 70 mm. The distance $W_3$ in a range from about 15 mm to about 85 mm, and the distance $W_5$ is in a range from about 60 mm to about 85 mm, in some embodiments. A width $W_6$ of the opening 102 may be in a range from about 215 mm to about 295 mm, and a length $L_2$ of the opening 102 may be equal to the width $W_6$. The above dimensions are merely non-limiting examples. Other dimensions are also possible and are fully intended to be included within the scope of the present disclosure.

FIG. 2A and FIG. 2B illustrate side views of a mask pod 150 in an open state and a closed state, respectively. Referring to FIG. 2A, the mask pad 150 has an upper portion (e.g., a cover) which is referred to as an upper mask pod 153, and a lower portion (e.g., a base) which is referred to as a lower mask pod 155. The upper mask pod 153 also has a handle 151, which may be used by an operator (e.g., a human operator) to load the mask pod 150 into the load port 100 or to unload the mask pod 150 from the load port 100 (see FIG. 3).

The lower mask pod 155 serves as a base to carry a reticle 160. The lower mask pod 155 may have one or more supports 157, on which lies the reticle 160. The supports 157 may be made of a suitable material, such as a material that is stiff, and resistant to heat and chemicals encountered in semiconductor manufacturing environments, but not too hard to scratch the reticle. For example, polyetheretherketone (PEEK) may be used as the material for the supports 157.

FIG. 2B shows the mask pod 150 in closed state, where the lower mask pod 155 is locked inside the upper mask pod 153 by a locking mechanism (not shown) of the mask pod 150. Under normal condition, during transportation (e.g., loading into and unloading from a lithography tool) of the reticle 160, the reticle 160 is carried inside the mask pod 150, which is in the closed state, to prevent dust from falling onto the reticles 160 and/or to prevent damage (e.g., scratching) of the reticle 160. In a plan view, the mask pod 150 may have a rectangular shape with dimensions matching the dimensions of the opening 102 (see FIG. 1B) of the load port 100.

Figure 3:
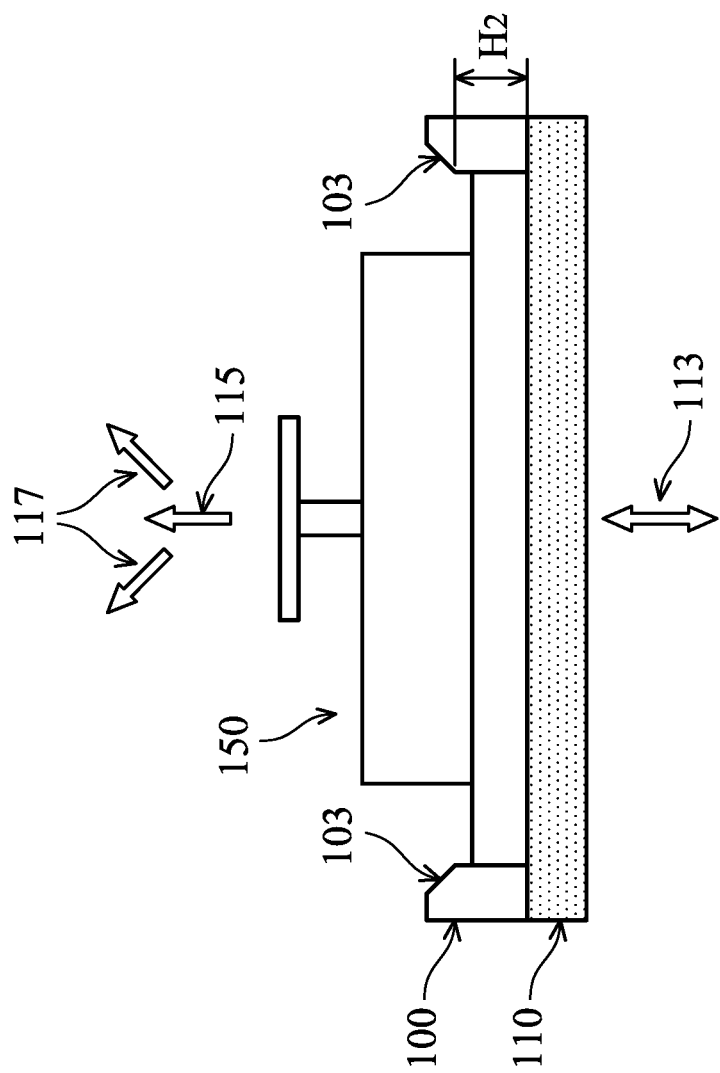
FIG. 3 is a cross-sectional view illustrating unloading of a mask pod from a load port, in accordance with some embodiments.

FIG. 3 illustrates the loading of the mask pod 150 into, and/or the unloading of the mask pod 150 from, the load port 100, in some embodiments. In the discussion herein, "loading and unloading the reticle" is used interchangeably with "loading and unloading the mask pod," since the reticle 160 is carrier by the mask pod 150 during the loading and the unloading operation.

As illustrated in FIG. 3, a movable base 110 of the load port 100, movable along an up-and-down direction 113, is docked with the load port 110. To load the reticle 160 into a lithography tool, the mask pod 150 is loaded onto the movable base 110 with the reticle 160 inside the mask pod 150. Thereafter, the movable base 110 moves downwards like an elevator, carrying the mask pod 150 into a lithography tool (not shown) disposed below the load port 100. Once inside the lithography tool, the mask pod 150 is opened, and the reticle 160 is removed from the mask pod 150 and used by the lithography tool for a photolithography processing.

After the photolithography process is finished, the reticle 160 is returned into the mask pod 150, the mask pod 150 closes, and the movable base 110 moves up like an elevator, carrying the mask pod 150 toward the load port 100. Once the movable base 110 docks with the load port 100, e.g., when the movable base 110 reaches the position illustrated in FIG. 3, the mask pod 150 is removed from (e.g., out of) the load port 100, such that the reticle 160 can be removed and stored, and/or a new reticle can be loaded into the mask pod 150 for another photolithography processing.

The unloading (e.g., removal) of the mask pod 150, may be done automatically by machines. However, during semiconductor manufacturing, abnormal conditions or emergencies may occur (e.g., loss of power), then the mask pod 150 may be removed by a human operator. In a proper unloading procedure, the mask pod 15 should be removed out of the load port 100 in a straight upward direction 115, e.g., a direction perpendicular to an upper surface of the movable base 110. However, when a human operator removes the mask pod 150 out of the load port 100, the mask pod 150 may not travel in the straight upward direction 115. Instead, the mask pod 150 may travel along directions, such as directions 117, that are not perpendicular to the upper surface of the movable base 110. In the present disclosure, a direction (e.g., 117) that is non-perpendicular to the upper surface of the movable base 110 is also referred to as a non-perpendicular direction, and a movement (e.g., by the mask pod 150) along a non-perpendicular direction is referred to as a non-perpendicular movement. Damage to the reticle 160, the mask pod 150, and/or the load port 100 may occur when the mask pod 150 is removed from the load port 100 along non-perpendicular directions, as will described in more details hereinafter.

The load port 100 has chamfers 103 which make it easy to fit the mask pod 150 into the openings 102 of the load port 100. The chamfers 103, however, reduce the height of the interior sidewalls of the load port 100 to $H_2$. Since the interior sidewalls 105 of the load port 100 limit lateral movement of the mask pod 150, the chamfers 103 reduces the effectiveness of the interior sidewalls 105 in terms of limiting lateral movement of the mask pod 150. Once the mask pod 150 moves higher than $H_2$ from the movable base 110, gaps between the chamfers 103 and the mask pod 150 allow for lateral movement of the mask pod 150, thus may result in non-perpendicular movement of the mask pod 150 by a human operator.

In removal of the mask pod 150 along non-perpendicular directions, excessive contact between the mask pod 150 and the load port 100, such as bumping or scratching, may occur, which may cause damage to the mask pod 150, load port 100, or even the reticle 160 inside the mask pod 150. In addition, loose particles from the scratches of the mask pod 150 and/or load port 100 may pollute the reticle 160. Under certain abnormal conditions, the upper mask pod 153 may not lock securely with the lower mask pod 155, and may separate from the lower mask pod 155 during the removal of the mask pod 150 from the load port 100. If separation of the upper mask pod 153 from the lower mask pod 155 happens when the mask pod 150 is moving upward in the load port 100, the reticle 160 may fly out of the load port 100 due to a suction force generated by a tight fit between the load port 100 and the mask pod 150 and the upward movement of the upper mask pod 153, resulting in serious damage to the reticle 160. The present disclosure addresses these issues with various design features.

Figure 4:
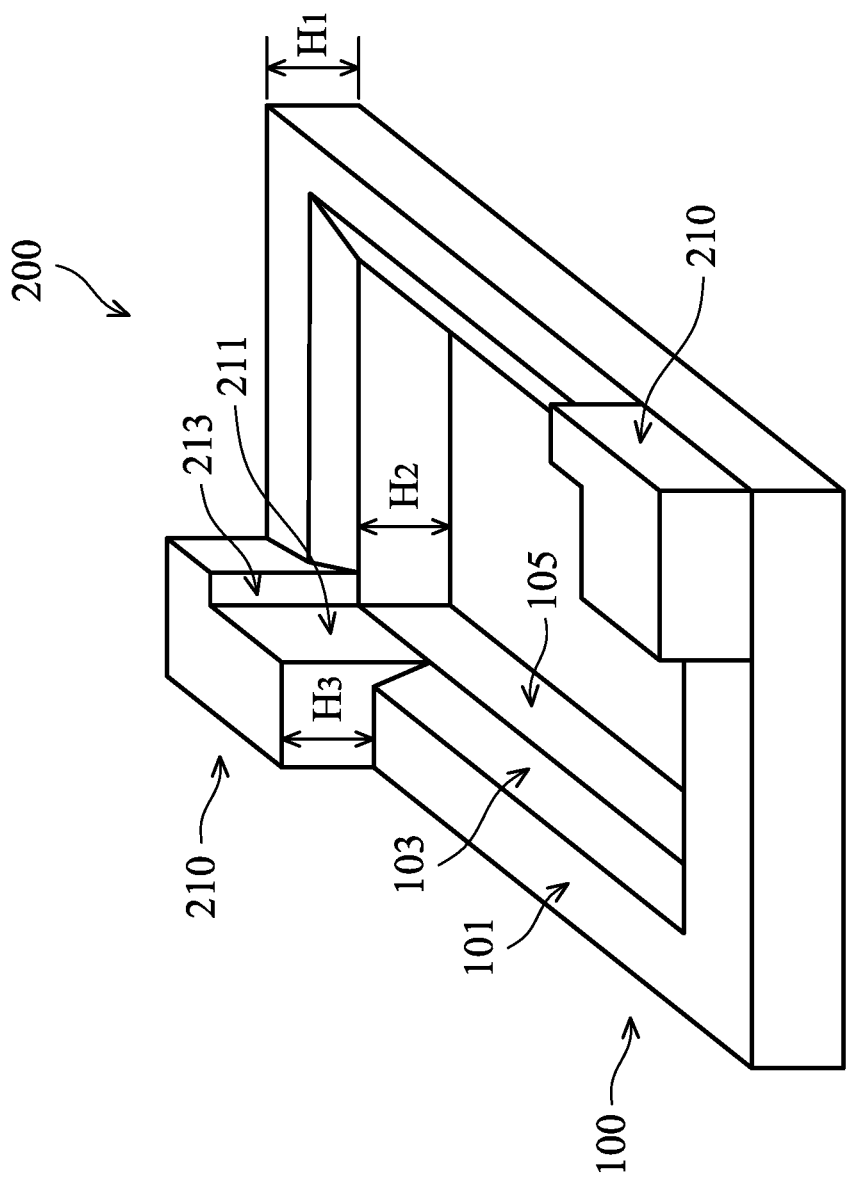
FIG. 4 illustrates a perspective view of a load port with load port supporters attached thereto, in accordance with some embodiments.

FIG. 4 illustrates a perspective view of a load port 200, in some embodiments. The load port 200 in FIG. 4 includes the load port 100 of FIG. 1A, and two load port supporters 210 attached to two diagonal upper corners of the load port 100. As illustrated in FIG. 4, a shape of the load port supporters 210 is substantially an L-shaped prism, with the bottom portions of the L-shaped prism modified to match the profile of the upper surface 101 and the chamfers 103 of the load port 100.

The load port supporters 210 are made of a rigid material, such as steel, aluminum titanium alloy, or polyether ether ketone (PEEK). In some embodiment, a hardness of the load port supporters 210 is equal to or higher than a hardness of the load port 100. Having load port supporters 210 with equal or higher hardness than the load port 100 may reduce the chances of scratching the load port supporter 210 during loading and unloading of the mask pod 150. The load port supporters 210 are attached (e.g., fastened) to the load port 100 securely via any suitable method, such as screws. The surface of the load port supporters 210 may be coated with a coating material such as chromium or tungsten to reduce or prevent scratching.

As illustrated in FIG. 4, each load port supporter 210 has two inner sidewalls 211 and 213 that are flush with respective interior sidewalls 105 of the load port 100. In a plan view, the four inner sidewalls (e.g., two inner sidewalls from each load port supporter 210) of the two load port supporters 210 define (e.g., delimit) a rectangular area that is the same as (e.g., overlaps) the opening 102 (see FIG. 1B) of the load port 100.

As illustrated in FIG. 4, the two load port supporters 210 increase the effective height of the interior sidewalls of the load port 200 to $H_1+H_3$, where $H_1$ is the height of the exterior sidewalls of the load port 100, and $H_3$ is a height between the upper surface 101 of the load port 100 and the L-shaped top surface of the load port supporter 210. Therefore, lateral movement (e.g., a non-perpendicular movement) of the mask pod 150 is reduced or prevented for a longer distance (e.g., $H_1+H_3$). Since the mask pod 150 has to travel upward for a longer distance (e.g., $H_1+H_3$), in the event of a separation of the upper mask pod 153 from the lower mask pod 155, it is less likely that the reticle 160 will fly out of the load port 200, thus reducing the chances of serious damage to the reticle 160.

Figure 5B:
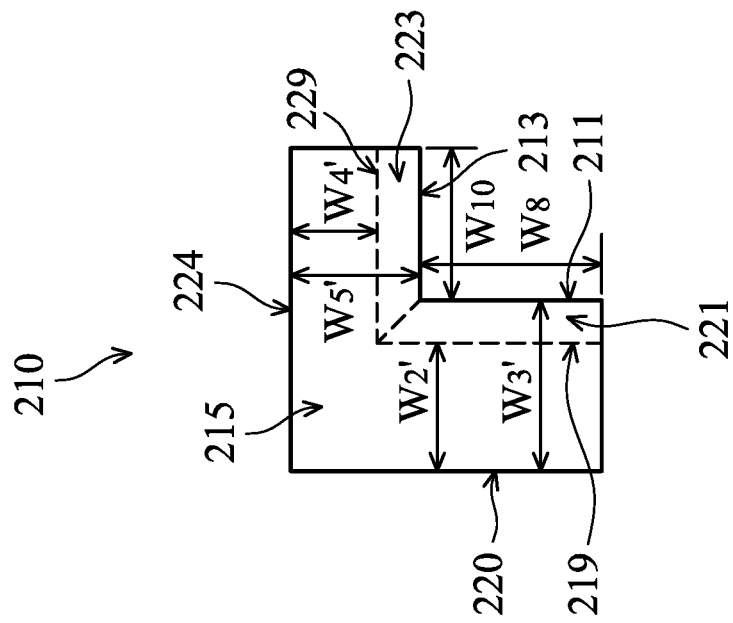
FIGS. 5A and 5B illustrate a perspective view and a plan view, respectively, of the load port supporter in FIG. 4, in accordance with some embodiments.
Figure 5A:
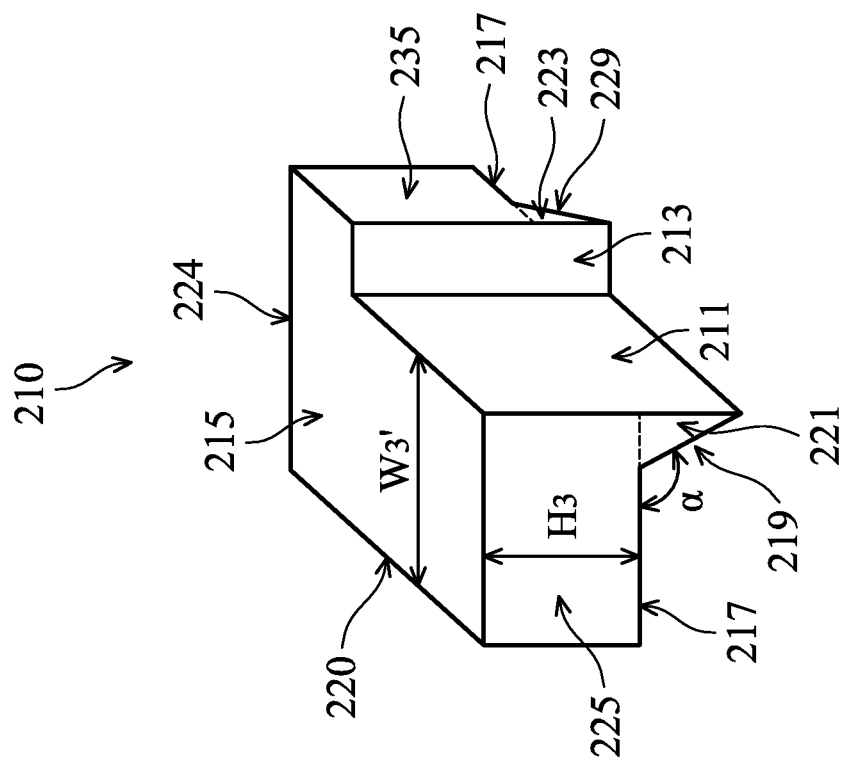

FIG. 5A and FIG. 5B illustrate a perspective view and a plan view of the load port supporter 210 of FIG. 4, respectively. As illustrated in FIG. 5A, the shape of the load port supporter 210 comprises an L-shaped rectangular prism, with a first bottom extension 221 and a second bottom extension 223 attached to a bottom surface 217 (shown as an edge in FIG. 5A) of the load port supporter 210. In other words, without the first bottom extension 221 and without the second bottom extension 223, the load port supporter 210 in FIG. 5A would have a shape of an L-shaped prism, which L-shaped prism has an L-shaped upper surface 215, an L-shaped bottom surface 217, and six rectangular sidewalls. With the first bottom extension 221 and the second bottom extension 223, however, the sidewall 225 and the sidewall 235 of the load port supporter 210 have shapes that are a combination of a rectangular and a triangle, and the other four sidewalls (e.g., 211 and 213) still have rectangular shapes. In addition, two slanted surfaces 219 and 229 are added to the surfaces of the load port supporter 210, resulting a total of ten surfaces (e.g., a top surface, a bottom surface, six sidewalls, and two slanted surfaces) for the load port supporter 210.

As illustrated in FIG. 5A, the first bottom extension 221 is below the bottom surface 217, and a cross-section of the first bottom extension 221 along sidewall 225 has a shape of a triangle, which triangle is below the dashed line illustrated on the sidewall 225. A slanted surface 219 (shown as an edge in FIG. 5A) of the first bottom extension 221 forms an angle α with the bottom surface 217 of the load port supporter 210. The angle α may be between 90 degrees to about 180 degrees, such as 135 degrees. In some embodiments, the angle α is equal to an angle between the upper surface 101 and the chamfer 103 of the load port 100 (see FIG. 4). Since the bottom surface 217 and the slanted surface 219 of the load port supporter 210 contact the upper surface 101 and the chamfer 103 of the load port 100, respectively, having the angle α matching the angel between the upper surface 101 and the chamfer 103 will ensure a good fit between the load port supporter 210 and the load port 100. Similarly, the second bottom extension 223 also has a triangular cross-section at the sidewall 235. In addition, a slanted surface 229 of the second bottom extension 223 and the bottom surface 217 form the angle α. In some embodiments, a height $H_3$ (see FIG. 5A) of the load port supporter 210, measured between the upper surface 215 and the bottom surface 217, is in a range from about 30 mm to about 100 mm.

FIG. 5B shows the plan view of the load port supporter 210, with the first bottom extension 221 and the second bottom extension 223 illustrated in phantom. Referring to FIG. 5B, the upper surface 215 of the load port supporter 210 has a width W3' between an outer sidewall 220 and the inner sidewall 211, and a width W5' between an outer sidewall 224 and the inner sidewall 213. In addition, the bottom surface 217 of the load port supporter 210 has a width W2' between the outer sidewall 220 and the slanted surface 219, and a width W4' between the outer sidewall 224 and the slanted surface 229.

In some embodiments, the width $W_3'$ is in a range from about 15 mm and to about 55 mm. The width $W_5'$ may be in a range from about 40 mm to about 60 mm. The width $W_2'$ may be in a range from about 5 mm to about 50 mm, and the width $W_4'$ may be in a range from about 30 mm to about 50 mm. In some embodiments, the width $W_3'$ and the width $W_5'$ are the same as the width $W_3$ and the width $W_5$ illustrated in FIG. 1B, respectively. In some embodiments, the width $W_2'$ and the width $W_4'$ are the same as the width $W_2$ and the width $W_4$ illustrated in FIG. 1B, respectively. A width $W_8$ of the inner sidewall 211 is in a range from about 50 mm to about 70 mm, and a width $W_{10}$ of the inner sidewall 213 is in a range from about 35 mm to about 55 mm.

Figure 6:
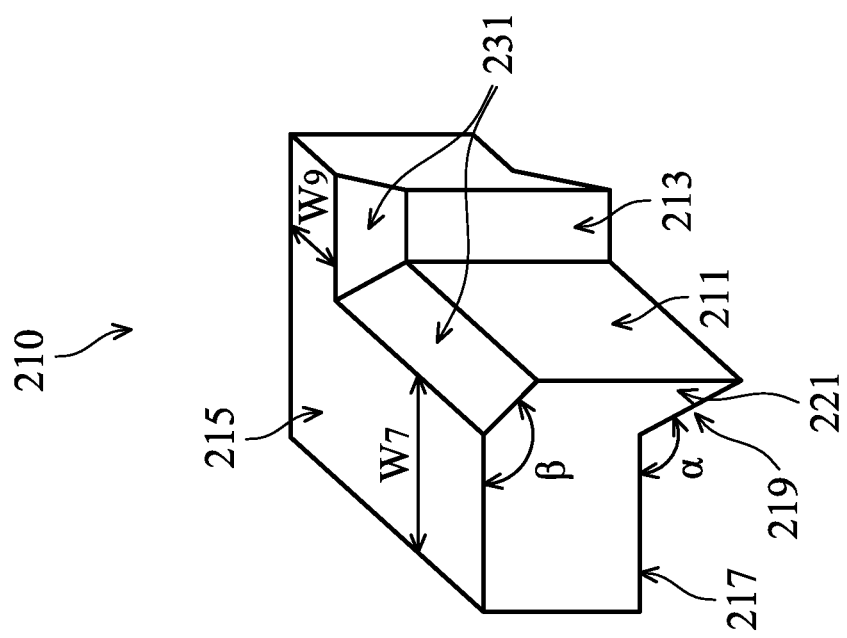
FIG. 6 illustrates a perspective view of another load port supporter, in accordance with some embodiments.

FIG. 6 illustrates another load port supporter 210 that may be used in place of, or with, the load port supporter 210 in FIG. 5A, in accordance with an embodiment. The load port supporter 210 in FIG. 6 is similar to the load port supporter 210 in FIG. 5A, but with the addition of two chamfers 231 between the upper surface 215 and the inner sidewalls 211/213. Each chamfer 231 form an angle β with the upper surface 215 of the load port supporter 210. The angle β is the same as the angle α between the lower surface 217 and the slanted surface 219 of the first bottom extension 221, in some embodiments, although the angle α may also be different from the angle β. By having the chamfers 231, it is easier to load the mask pod 150 into the load port 200.

In some embodiments, a width $W_7$ of the upper surface 215 of the load port supporter 210 of FIG. 6 is in a range from about 30 mm to about 50 mm, and a width $W_9$ of the upper surface 215 is in a range from about 5 mm to about 50 mm. In some embodiments, the width $W_7$ and the width $W_9$ are equal to the width $W_2'$ and the width $W_4'$ in FIG. 5B, respectively.

Although two load port supporters 210 are illustrated in FIG. 4, more than two load port supporters, such as three, or four load port supporters may be used. For example, one or two more additional load port supporters 210 may be attached to the unoccupied upper corners (e.g., the bottom left and/or the top right corner in FIG. 4) of the load port 100. In embodiments where two load port supporters are used, the two load port supporters can be attached to any two diagonal corners. For example, instead of the top left and the bottom right corner as illustrated in FIG. 4, the two load port supporters 210 may be attached to the bottom left and the top right corners of the load port 100. These and other variations to the design of the load port 200 are fully intended to be included within the scope of the present disclosure.

Figure 7:
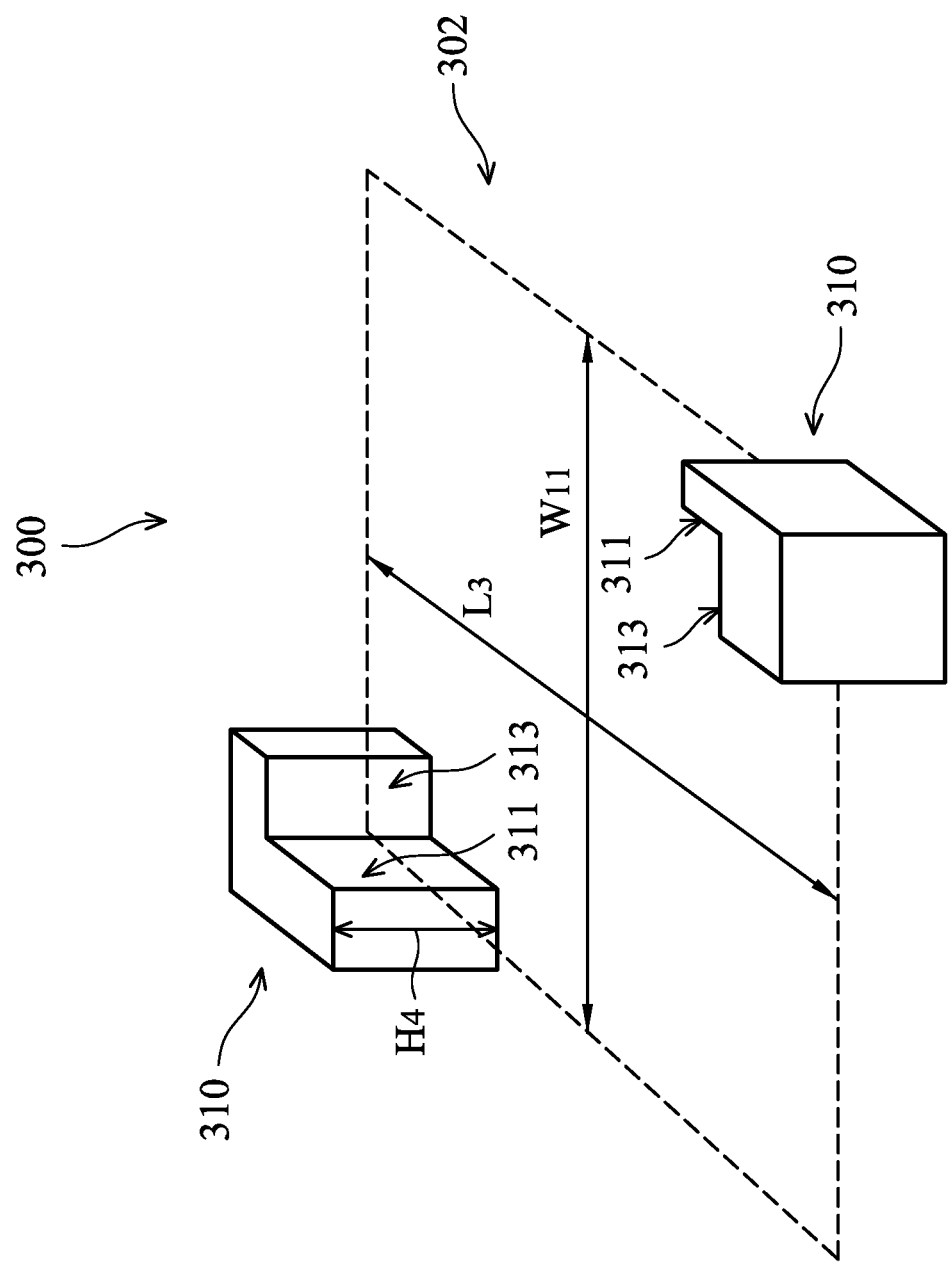
FIG. 7 illustrates a perspective view of a load port comprising load port supporters, in accordance with some embodiments.

FIG. 7 illustrates another load port 300 in accordance with an embodiment. In FIG. 7, the load port 300 comprises two load port supporters 310, and the ring-shaped load port 100 (see FIG. 4) is not used in the load port 300. Each of the load port supporters 310 has a shape of an L-shaped rectangular prism. The material for the load port supporters 310 may be similar to that of the load port supporters 210, details are not repeated here. A height $H_4$ of the load port supporter 310 is larger than the height $H_1$ (see FIG. 4) of the load port 100, thereby providing more control of lateral movement of the mask pod 150 to force a straight-up movement of the mask pod 150 during unloading. A taller load port supporter 310 also reduces the risk of the reticle 160 flying out of the load port 300 when separation of the upper mask pod from the lower mask pod happens.

As illustrated in FIG. 7, the four inner sidewalls 311/313 of the two load port supporters 310 defines (e.g., delimit) the boundary of a rectangular area 302 with a width $W_{11}$ and a length $L_3$. The dimensions (e.g., $L_3$ and $W_{11}$) of the rectangular area 302 match the dimension of the mask pod 150, or the dimension of the opening 102 (see FIG. 1B) of the load port 100, in some embodiments. An advantage of the load port 300 is that by adjusting the distances between the two load port supporters 310, the same load port supporters 310 can be reconfigured to form load port 300 with different dimensions (e.g., $L_3$ and $W_{11}$) to accommodate mask pod 150 with different sizes.

Figure 8:
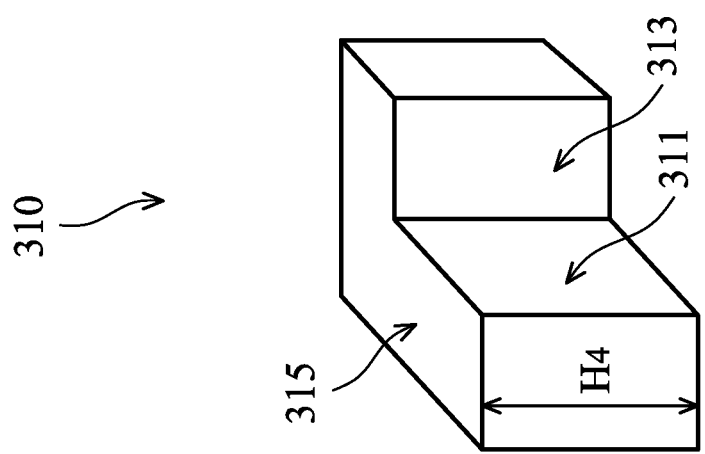
FIG. 8 illustrates a perspective view of the load port supporter shown in FIG. 7, in accordance with some embodiments.

FIG. 8 shows a perspective view of the load port supporter 310 illustrated in FIG. 7. In some embodiments, the height $H_4$ of the load port supporters 310 is in a range from about 30 mm to about 50 mm. Other dimensions of the load port supporter 310 may be similar to corresponding dimensions of the load port supporter 210 in FIGS. 5A and 5B, thus details are not repeated here.

Figure 9:
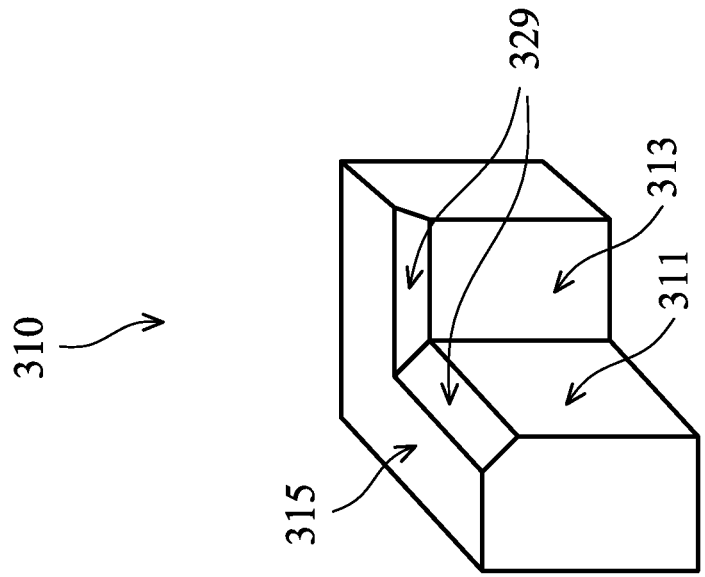
FIG. 9 illustrates a perspective view of another load port supporter, in accordance with some embodiments.

FIG. 9 shows a perspective view of another load port supporter 310 that may be used in place of, or with, the load port supporter 310 in FIG. 8, in accordance with an embodiment. The load port supporter 310 in FIG. 9 is similar to the load port supporter 310 in FIG. 8, but with two chamfers 329 between the upper surface 315 and two inner sidewalls 311 and 313. The chamfers 329 facilitate loading of the mask pod 150 into the load port 300.

Although two load port supporters 310 are illustrated in FIG. 7, more than two load port supporters, such as three, or four load port supporters may be used. For example, one or two more additional load port supporters 310 may be disposed at the unoccupied corners (e.g., the bottom left and/or the top right corner in FIG. 7) of the rectangular area 302. In embodiments where two load port supporters 310 are used, the two load port supporters 310 can be disposed at any two diagonal corners. For example, instead of the top left and the bottom right corner as illustrated in FIG. 7, the two load port supporters 310 may be disposed at the bottom left and the top right corners of the rectangular area 302. These and other variations to the design of the load port 300 are fully intended to be included within the scope of the present disclosure.

Figure 10:
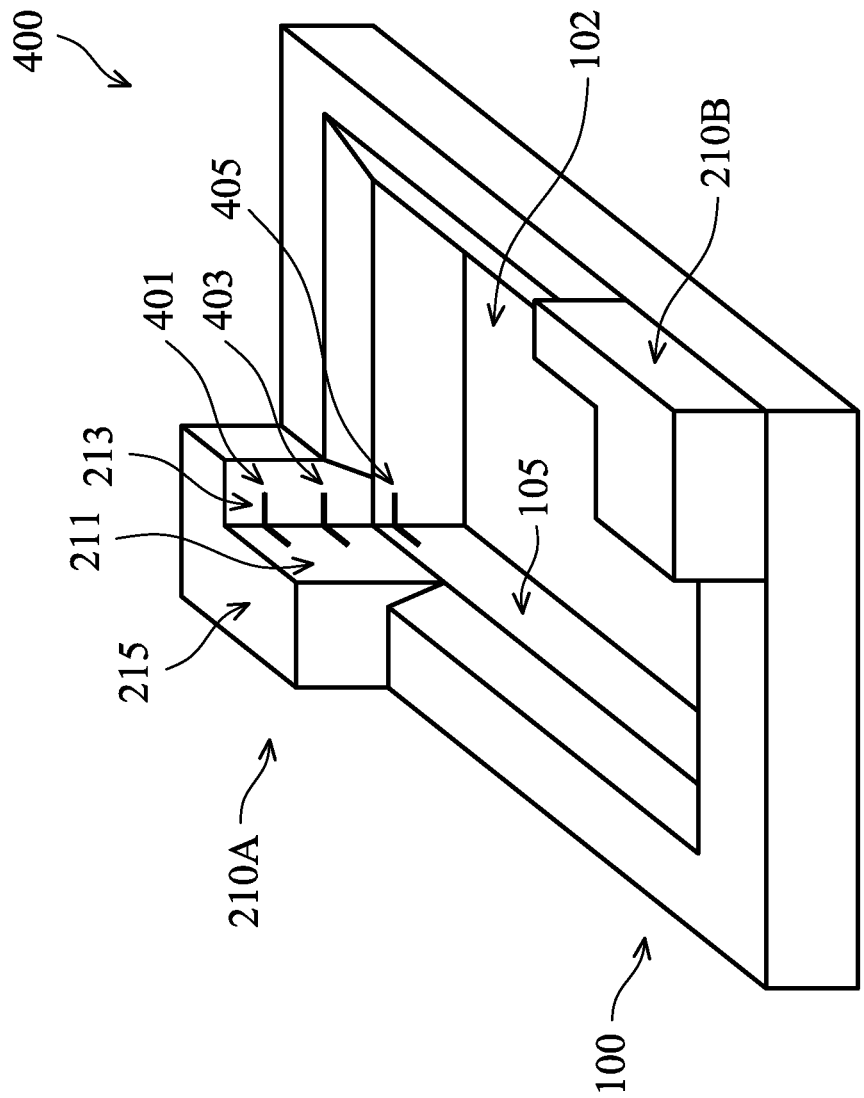
FIG. 10 illustrates a perspective view of a smart load port with sensors, in accordance with some embodiments.

FIG. 10 illustrates a perspective view of a load port 400 in accordance with an embodiment. The load port 400 is similar to the load port 200 in FIG. 4, but with a plurality of sensors (e.g., 401, 405) and locking devices (e.g., 403) embedded in the load port 400. In particular, for each of the load port supporters 210 (e.g., 210A or 210B), a first optical sensor 401 is embedded in the inner sidewall 211 and/or the inner sidewall 213 of the load port supporter 210, and a second optical sensor 405 is embedded in the interior sidewall(s) 105 of the load port 100 and is disposed below the first optical sensor 401. Exterior surfaces of the optical sensors (e.g., 401 and 405) are flush with the inner sidewall 211 and/or the inner sidewall 213, or are recessed from the inner sidewall 211 and/or the inner sidewall 213, so that the optical sensors (e.g., 401 and 405) do not interfere with the movement (e.g., up or down movement) of the mask pod 150 inside the load port 400.

For each load port supporter 210, a locking device 403 is embedded in the inner sidewall 211 and/or the inner sidewall 213, and is between the first optical sensor 401 and the second optical sensor 405. When the locking device 403 is in a non-active state (e.g., locking device 403 not deployed), exterior surfaces of the lock device 403 is flush with the inner sidewall 211 and/or the inner sidewall 213, or are recessed from the inner sidewall 211 and/or the inner sidewall 213, so that the locking device 403 does not interfere with the movement of the mask pod 150 inside the load port 400. When the locking device 403 is in an active state (e.g., locking device 403 deployed), the locking device 403, or portions of it, protrudes into the opening 102 of the load port 400 to limit (e.g., block) the movement of the mask pod 150 inside the load port 400, details of which will be discussed hereinafter.

Still referring to FIG. 10, each of the optical sensors 401/405 in the load port supporter 210A form a pair of optical sensors with corresponding optical sensors 401/405 (not visible in the perspective view of FIG. 10) in the load port supporters 210B. For example, the first optical sensor 401 in the load port supporter 210A may be an optical transmitter, and the first optical sensor 401 in the load port supporter 210B may be an optical receiver, or vice versa. Therefore, the two corresponding optical sensors (e.g., the optical sensor 401 in 210A and the optical sensor 401 in 210B) form a pair of optical sensors for transmitting (by one optical sensor) and receiving (by the other optical sensor) optical signals. The present disclosure allows great flexibility in assigning the locations (e.g., in 210A or in 210B) of the optical transmitter and the optical receiver in a pair. For example, the optical sensors 401/405 in load port supporter 210A may both be optical transmitters. As another example, the optical sensors 401/405 in the load port supporter 210A may both be optical receivers. As yet another example, the optical sensors 401/405 in the load port supporter 210A may include an optical transmitter and an optical receiver.

The optical sensors 401/405 may transmit or receive laser signals, infra-red (IR) signals, or other directional signals, such that the signals transmission between a pair of optical sensors would not interfere with signals transmission between another pair of optical sensors. For example, laser signals may be used to establish a light-of-sight (LOS) communication channel between a pair of optical sensors. The signals received by the receiving optical sensor will be processed to detect an abnormal condition of the mask pod, and to deploy the locking device 403 to prevent damage to the reticle, as will be discussed in more details hereinafter with reference to FIGS. 12-17. Through the present disclosure, load ports with sensors may also be referred to as smart load ports.

The load port supporter 210 shown in FIG. 10 may be have chamfers formed between the upper surface 215 and the inner sidewalls 211/213, similar to the chamfers 231 in FIG. 6. The optical sensors 401/405, and the locking device 403 are illustrated in FIG. 10 as being embedded in both inner sidewalls 211 and 213 of the load port supporter 210. Depending on the size of the optical sensors 401/405 and the size of the locking device 403, the optical sensors 401/405 and/or the locking device 403 may be embedded in one of the inner sidewalls (e.g., 211 or 213), or may be embedded along the edge where the two inner sidewalls 211 and 213 intersect with each other. In addition, the second optical sensor 405 is illustrated as being embedded in the interior sidewall 105 of the load port 100, however, the second optical sensor 405 may also be embedded in the inner sidewall 211 and/or the inner sidewall 213 of the load port supporter 210. Furthermore, the locations (e.g., the distance between the optical sensor 401/405, the locking device 403, and a bottom surface of the load port 100) of the optical sensors 401/403 and/or the location of the locking device 403 may be changed according to various factors such as the size of the mask pod 150, size of the load port 100, and the size of the load port supporter 210. These and other variations to the design of the load port 400 are fully intended to be included within the scope of the present disclosure.

Figure 11:
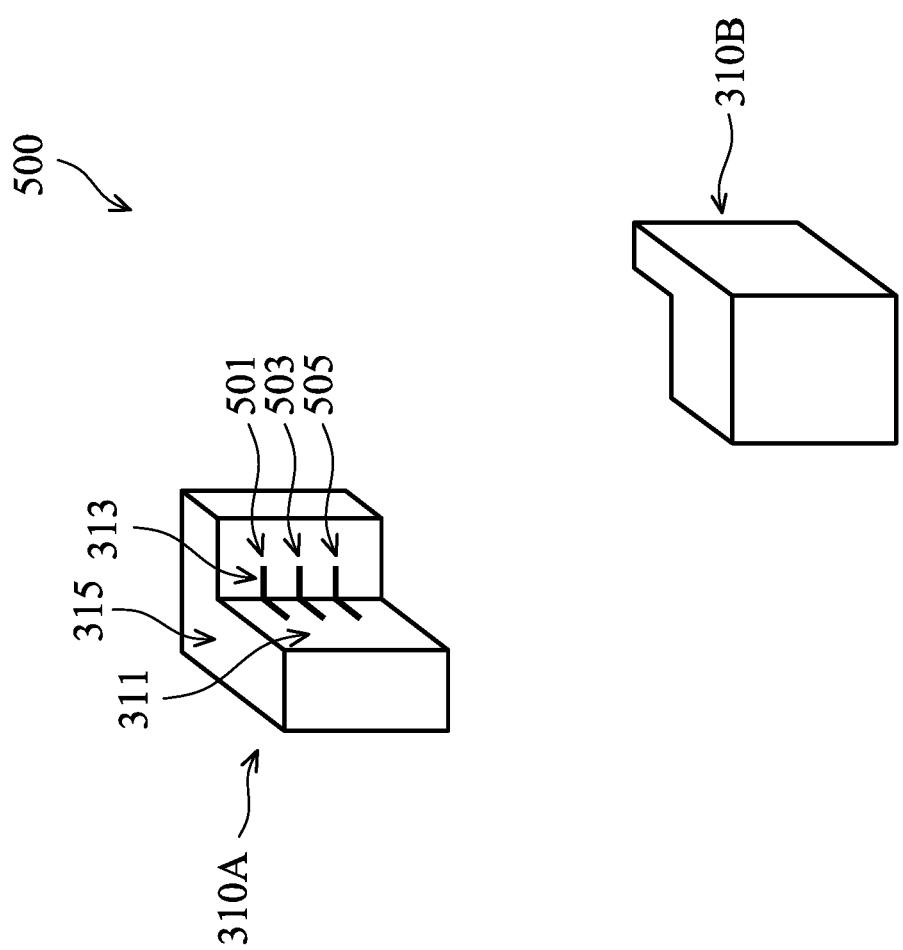
FIG. 11 illustrates a perspective view of a smart load port with sensors, in accordance with some embodiments.

FIG. 11 illustrates a perspective view of a smart load port 500 in accordance with an embodiment. The smart load port 500 is similar to the load port 300 illustrated in FIG. 7, but with optical sensors 501/505 and locking devices 503 embedded in the inner sidewalls 311/313 of the load port supporters 310. In particular, for each load port supporter 310, a first optical sensor 501, a locking device 503, and a second optical sensor 505 are embedded in the inner sidewall 311 and/or the inner sidewall 313 of the load port supporter 310, with the locking device 503 between the first optical sensor 501 and the second optical sensor 505. Corresponding optical sensors in the pair of load port supporters, e.g., a first optical sensor 501 in load port supporter 310A and a first optical sensor 501 (not visible in FIG. 11) in load port supporter 310B, form a pair of optical sensors. In the example of FIG. 11, two pairs of optical sensors (e.g., 501 in 310A and 501 in 310B, 505 in 310A and 505 in 310B) are formed. Each pair of the optical sensors include an optical transmitter and an optical receiver. Directional signals (e.g., laser, IR) are used to maintain a directional communication link between each pair of optical sensors without interfering with the other pair(s) of optical sensors. Details of the optical sensors 501/505 and locking device 503 are similar to those of optical sensors 401/405 and locking device 403 in FIG. 10, respectively, thus details are not repeated here.

Modification to the load port 500 are possible. For example, chamfers may be formed between the upper surface 315 and the inner sidewalls 311/313 of the load port supporters 310, similar to the chamfers 329 in FIG. 9. Locations of the optical sensors 501/505 and locking device 503 may be adjusted according to various factors such as the size of the mask pod 150, and the size of the load port supporter 310. These and other variations to the design of the load port 500 are fully intended to be included within the scope of the present disclosure.

FIGS. 12-15 illustrate a method of removing a mask pod from a smart load port, in some embodiments. The smart load port 500 of FIG. 11 is used as an example in the illustrated embodiment, with the understanding that other smart load port, such as the smart load port 400 of FIG. 10, may also be used without departing from the spirit of the present disclosure.

Figure 12:
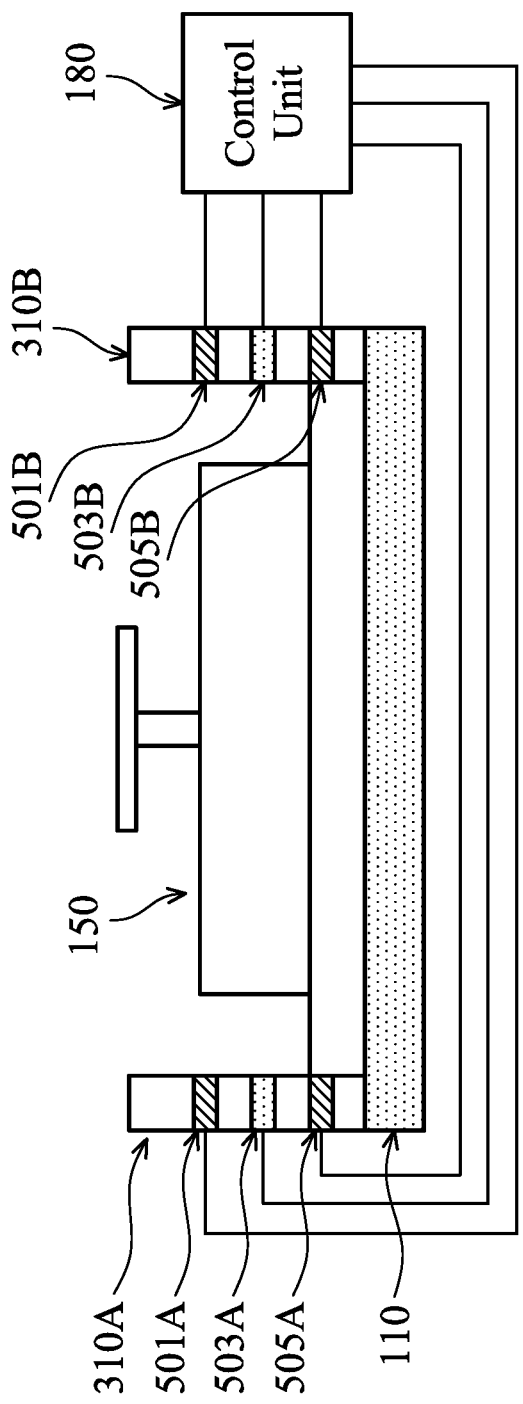
FIGS. 12-15 are cross-sectional views illustrating a method for detecting an abnormal condition of the mask pod using a smart load port, in accordance with some embodiments.

FIG. 12 shows the cross-sectional views of the smart load port 500, the movable base 110 of the smart load port 500, and the mask pod 150. For simplicity, the lower mask pod and the reticle carried inside the mask pod 150 are not shown. FIG. 12 shows a control unit 180 coupled to optical sensors 501A/505A and a locking device 503A in load port supporter 310A. The control unit 180 is also coupled to optical sensors 501B/505B and a locking device 503B in load port supporter 310B. The control unit 180 may be a micro-controller, a central processing unit (CPU), an application specific integrated circuit (ASIC), or other suitable controller. The coupling between the control unit 180 and the optical sensors 501/505 and the locking devices 503 may be through wires (e.g., copper wire, coaxial cable, optical fiber) or through wireless channels (e.g., WiFi, Bluetooth, or other standard or proprietary wireless protocols). For simplicity, the control unit 180 and the coupling between the control unit 180 and the optical sensors 501/505 and the locking devices 503 are not shown in FIGS. 13-17, with the understanding that the control unit 180 and the coupling are still present in FIGS. 13-17.

Without loss of generality, solely to facilitate the discussion below, the optical sensors 501A and 505A in the load port supporter 310A are assumed to be optical transmitters, and the optical sensors 501B and 505B in the load port supporter 310B are assumed to be optical receivers.

Referring to FIG. 12, at the beginning of the unloading process, the mask pod 150, with the reticle 160 (not shown) inside, is on the movable base 110 and is ready to be removed from the smart load port 500. The control unit 180 instructs the optical transmitters 501A and 505A to transmit optical signals, and checks the output of the optical receivers 501B and 505B. Since the mask pod 150 is between the first pair of optical sensors 501A/501B and the second pair of optical sensors 505A/505B, the transmitted optical signals are blocked by the mask pod 150, and the outputs of the optical receivers 501B/505B indicate that no optical signal is received at 501B and 505B. Using a notation of "1" and "0" to indicate respectively "optical signal received" and "no optical signal received," and using a binary two-bit word [$B_1 B_0$] to represent the outputs from the optical receivers 501B/505B, with bits $B_1$ and $B_0$ corresponding to the outputs of the optical receivers 501B and 505B, respectively, the outputs of the optical receivers 501B/505B in FIG. 12 are represented by a two-bit word [00]. The value of the two-bit word [$B_1 B_0$] is also referred to as the state of the optical receivers 501B/505B. Following the convention of treating bit $B_1$ as the most significant bit (MSB) of the two-bit word and bit B0 as the least significant bit (LSB) of the two-bit word, the state of the optical receivers 501B/505B in FIG. 12 is 0.

Figure 13:
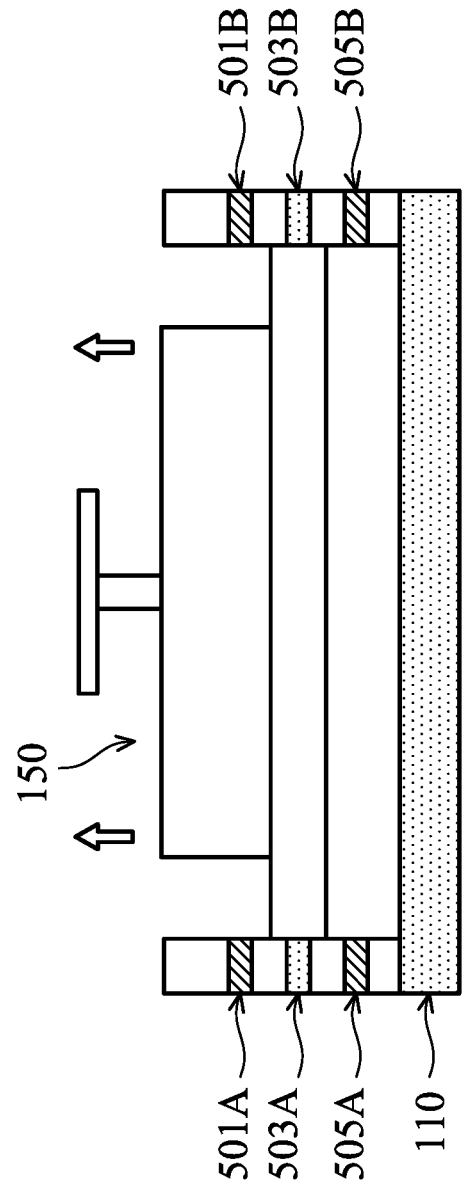

Next, as illustrated in FIG. 13, the mask pod 150 is moving upward and clears (e.g., move above) the communication path between the second pair of optical receiver 505A/505B, but still blocks the communication path between the first pair of optical receivers 501A/501B. As a result, the output of the second optical receiver 505B indicates "optical signal received," while the output of the optical receiver 501B indicates "optical signal not received." Therefore, the outputs of the optical receivers 501B/505B in FIG. 13 are represented by a two-bit word [01], and the state of the optical receivers 501B/505B in FIG. 13 is 1.

Figure 14:
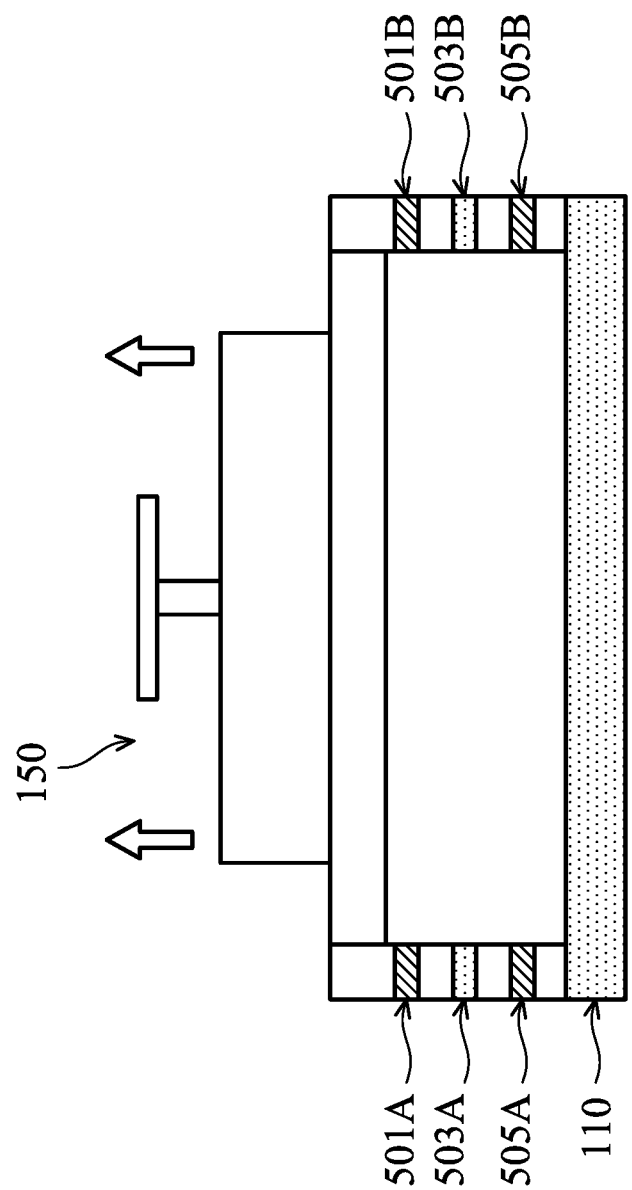

Next, as illustrated in FIG. 14, the mask pod 150 moves further upward and clears the communication path between both the first pair of optical sensors 501A/501B and the second pair of optical sensors 505A/505B. As a result, the output of first optical receiver 501B and output of the second optical receiver 505B both indicate "optical signal received." Therefore, the outputs of the optical receivers 501B/505B in FIG. 14 are represented by a two-bit word [11], and the state of the optical receivers 501B/505B in FIG. 14 is 3.

FIGS. 12-14 illustrate the normal operating conditions for unloading the mask pod 150 from the smart load port. Therefore, the state of the optical receivers 501B/505B, as illustrated in FIGS. 12-14, changes in the following sequence: 0→1→3.

Figure 15:
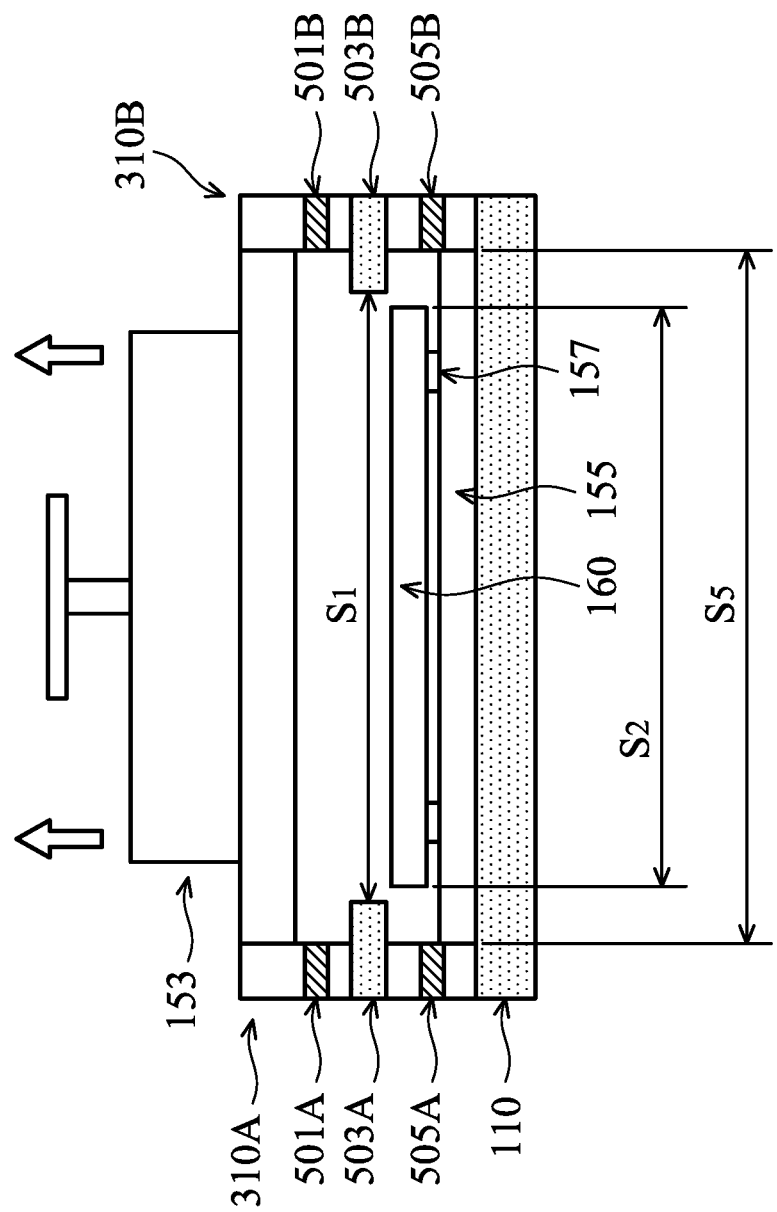

FIG. 15 illustrate an abnormal condition of the mask pod 150, where the upper mask pod 153 separated from the lower mask pod 155 during removal of the mask pod 150. As illustrated in FIG. 15, after being separated from the upper mask pod 153, the lower mask pod 155 and the reticle 160 are left on the movable base 110 as the upper mask pod 153 travels upward and clears (e.g., not blocking) the communication path between the first pair of optical sensors 501A/501B. The communication path between the second pair of optical sensors 505A/505B are blocked by the lower mask pod 155. Therefore, the outputs of the optical receivers 501B/505B changes from [0 0] to [1 0] as the upper mask pod 153 travels upwards, in some embodiments. In other words, the state of the optical receivers 501B/505B under the abnormal condition changes in the following sequence: 0→2 in the illustrate embodiment. Note that the state 2 for the optical receivers 501B/505B does not appear in normal condition, and therefore, could be used by the control unit 180 to detect the abnormal condition. In some embodiments, the control unit 180 determines that an abnormal condition occurred of the mask pod 150 when the state of the optical receivers 501B/505B is 2.

In some embodiments, the control unit 180 monitors the transition of the state of the optical receivers 501B/505B (e.g., 0→1→3, or 0→2), and by analyzing the sequence of state, may determine more details regarding, e.g., how and when an abnormal condition occurred. For example, if the lower mask pod 155 initially moved above the second pair of optical sensors 505A/505B before being separated from the upper mask pod 153 and falling back onto the movable base 110, the sequence of state may show the following transition: 0→1→0→2. The control unit 180 may continuously monitor (e.g., sample the output of the optical receivers 501B/505B at a sampling frequency throughout the unloading process) the state of the optical receivers 501B/505B. The time stamp of the samples of the outputs of the optical receivers may provide the time when an abnormal condition (e.g., separation of the upper mask pad from the lower mask pod) happened. A reconstruction of the abnormal condition with detailed timing information may be possible by using the samples of the output of the optical receivers 501B/505B. Such a reconstruction may be used to improve operation procedures and to prevent future occurrence of the abnormal condition.

In some embodiments, in response to the detection of the abnormal condition, the control unit 180 activates, or deploys, the locking device 503A/503B. When activated, the locking devices 503A/503B protrude from the sidewalls of the load port supporter 310 into the space delimited by the inner sidewalls 311/313 (see FIG. 11) of the load port supporter 310. In some embodiments, the activated locking devices 503A/503B limit the movement of the lower mask pod 155, e.g., preventing it from moving upward passing the locking devices 503A/503B, thereby reducing the chance of the reticle 160 getting out of the load port 310 and being damaged. Warning signals, such as warning lights or alarm, may be triggered by the control unit 180, so that the abnormal condition may be handled and resolved properly by the operator.

In the example of FIG. 15, a distance $S_1$ between the locking device 503A and 503B is larger than a width $S_2$ of the reticle 160, but smaller than a width $S_5$ of the lower mask pod 155. Therefore, in limiting the movement of the lower mask pod 155, the locking devices 503A/503B may contact the lower mask pod 155 but may not contact the reticle 160.

Figure 16:
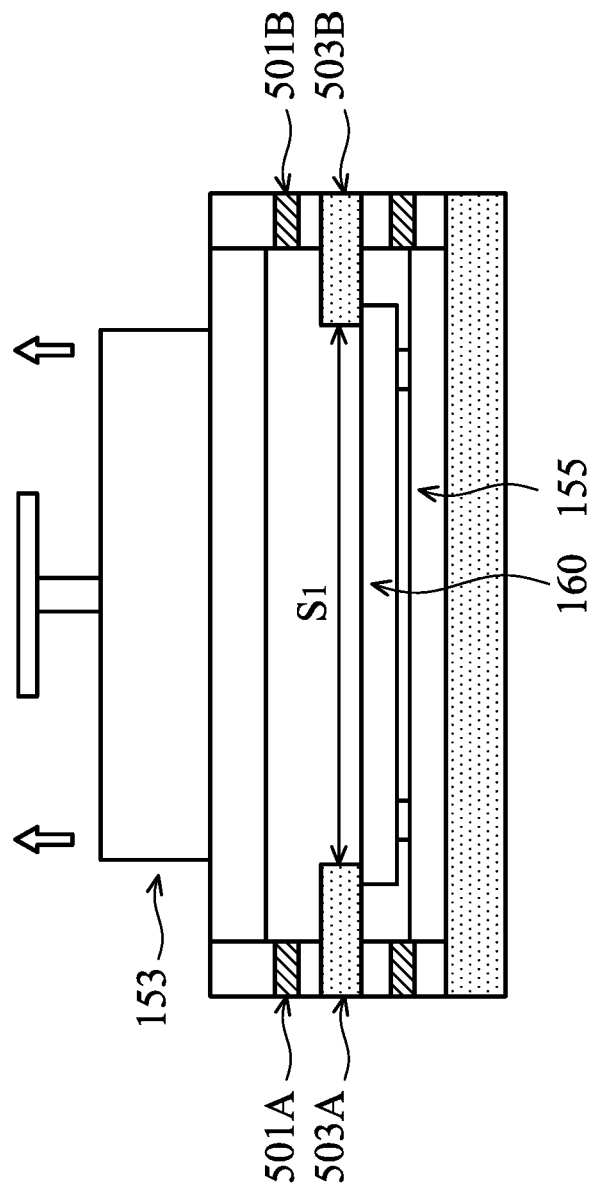
FIGS. 16-17 illustrate various designs for locking devices of the smart load port, in accordance with some embodiments.
Figure 17:
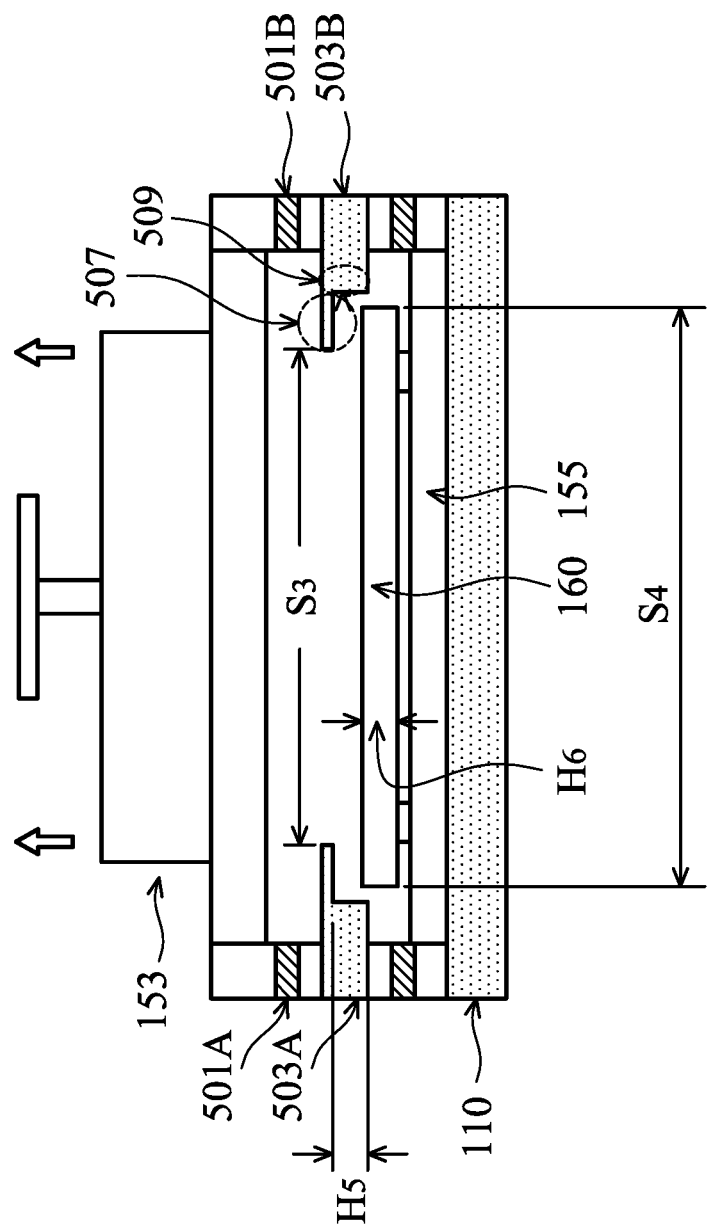

FIG. 16 and FIG. 17 illustrate two more examples of the locking devices 503 limiting the movement of the lower mask pod 155 and/or the reticle 160 under abnormal condition of the mask pod 150. FIG. 16 and FIG. 17 are similar to FIG. 15, but with different shapes and/or dimensions for the locking devices 503.

In FIG. 16, the distance 51 between the locking device 503A and 503B is smaller than the width $S_2$ (see FIG. 15) of the reticle 160, and is also smaller than the width $S_5$ (see FIG. 15) of the lower mask pod 155. Therefore, in limiting the movement of the lower mask pod 155, the locking devices 503A/503B may contact the reticle 160. This design may ensure that the reticle 160 will not move above the locking devices 503 and get out of the load port 310. The material of the locking device 503, or the portion of the locking device 503 that contacts the reticle 160, may be a suitable material (e.g., PEEK) to avoid scratching the reticle 160.

In FIG. 17, the locking devices 503A/503B has a step shape in a cross-sectional view. In particular, each locking device 503 comprise a first portion 507 and a second portion 509. The bottom surface of the second portion 509 is closer to the lower mask pod 155 than the bottom surface of the first portion 507. A distance $S_3$ between the first portions 507 of the locking devices 503A/503B is smaller than the width $W_5$ (see FIG. 15) of the reticle 160, and a distance $S_4$ between the second portions 509 are larger than the width $W_5$ of the reticle 160. Therefore, in limiting an upward movement of the lower mask pod 155, the second portion 509 may contact the lower mask pod 155, and the first portion 507 may contact the reticle 160.

Still referring to FIG. 17, in some embodiments, an offset H5 between the bottom surface of the first portion 507 and the bottom surface of the second portion 509 is equal to or larger than a distance H6 between the upper surface of the reticle 160 and the upper surface of the lower mask pod 155. This design may ensure that in limiting an upward movement of the lower mask pod 155 and the reticle 160, the bottom surface of the second portion 509 makes contact with the lower mask pod 155 at a same time as, or earlier than, the moment that the bottom surface of the first portion 507 makes contact with the reticle 160. Therefore, the full force of impact between the blocking devices 503 and the lower mask pod 155/reticle 160 is not absorbed by the reticle 160 alone. Instead, the lower mask pod 155 may absorb most of the impact force if $H_5$ is larger than $H_6$, or the lower mask pod 155 and the reticle 160 may share the impact force if $H_5$ is equal to $H_6$. By lowering the impact force experienced by the reticle 160, the design in FIG. 17 reduces the chance of the reticle 160 being damaged when the locking devices 503 are deployed. To further reduce the chance of damages to the reticle 160, the first portion 507 may be made of a material that is softer than that of the second portion 509. For example, the first portion 507 may be made of aluminum titanium alloy or PEEK, and the second portion 509 may be made of steel or aluminum titanium alloy. In other embodiments, the first portion 507 and the second portion 509 are made of a same material.

Figure 18A:
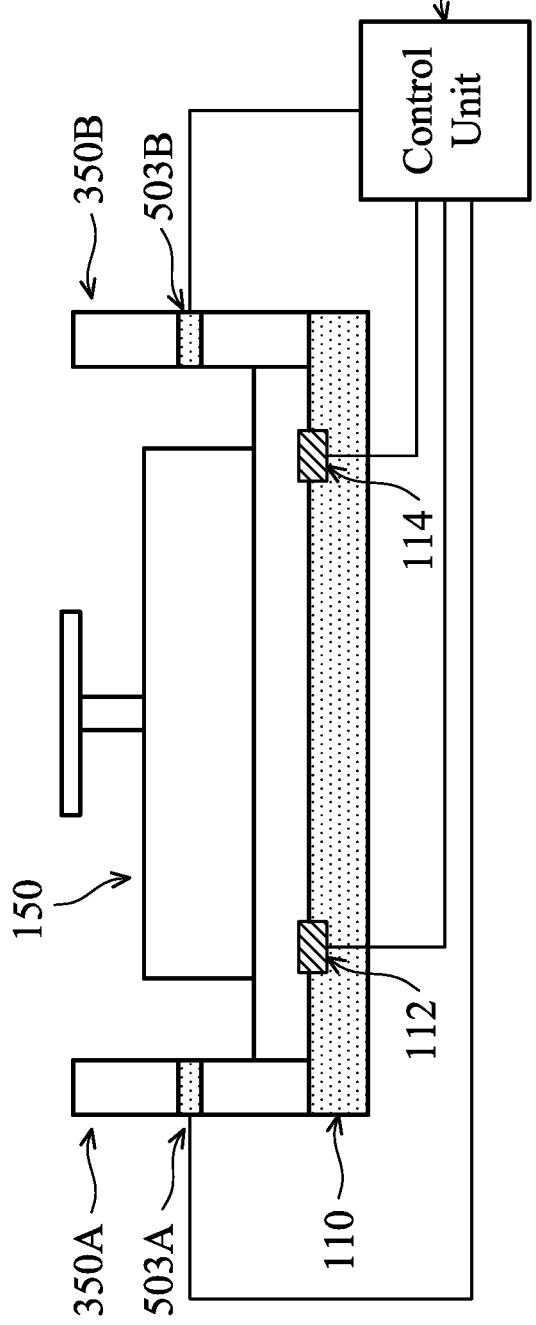
FIGS. 18A and 18B are cross-sectional views illustrating a method for detecting an abnormal condition of the mask pod using a smart load port, in accordance with some embodiments.

FIGS. 18A-21B illustrate various embodiments of method to prevent non-perpendicular movement of the mask pod 150 during the unloading process using smart load ports. Referring to FIG. 18A, cross-sectional views of a smart load port comprising load port supporters 350 (e.g., 350A and 350B), the movable base 110, and sensors 112/114 are shown. Each of the load port supporters 350 has a locking device 503 (e.g., 503A or 503B) built in. FIG. 18A also shows the movable base 110, which may be configured to move the mask pod 150 in and out of a lithography tool (not shown). On the upper surface of the movable base 110 are two sensors 112 and 114 proximate a left end and a right end of the movable base 110. The sensors 112 and 114 are configured to detect the position of the mask pod 150, e.g., as the mask pod 150 is being lifted up from the movable base 110. The sensors 112/114 and the locking devices 503 are coupled to a control unit 180. The control unit 180 monitors the output of the sensors 112/114 in real-time, and determines whether the mask pod 150 is being lifted up along the straight upward direction 115 in real-time. When the sensors 112/114 detect that the mask pod 150 is in a titled position (e.g., being lifted up in a non-perpendicular direction), the control unit 180 deploys the locking device 503 to limit the movement (e.g., stopping the mask pod 150) of the mask pod 150 to rectify the situation.

The sensors 112 and 114 may be any suitable sensors that could detect the position of the mask pod 150. In the example of FIG. 18A, the sensors 112 and 114 are two pressure sensors. In some embodiments, when the mask pod 150 is lying flat on the movable base 110, the outputs of the sensors 112 and 114 are substantially equal. Minor differences between the outputs (e.g., pressure values) of the sensors 112 and 114 may occur even when the mask pod 150 is lying flat on the movable base 110 due to, e.g., sensitivity differences between sensors 112 and 114. These minor differences between the outputs of the sensors 112 and 114, however, are small and within a pre-determined threshold. The pre-determined threshold may be determined by, e.g., analyzing and characterizing the sensitivity difference between the sensors 112 and 114, or by measuring the outputs of the sensors 112 and 114 through repeated experiments and heuristically determine the distribution of the output differences. The control unit 180 determines that the mask pod 150 is in a flat position (e.g., the bottom surface of the mask pod 150 is parallel to the upper surface of the movable base 110) when the magnitude of the difference between the outputs of the sensors 112 and 114 are within the pre-determined threshold, in some embodiments. A non-zero pre-determined threshold may help to reduce false alarm (e.g., incorrect detection of a titled position for the mask pod 150).

Figure 18B:
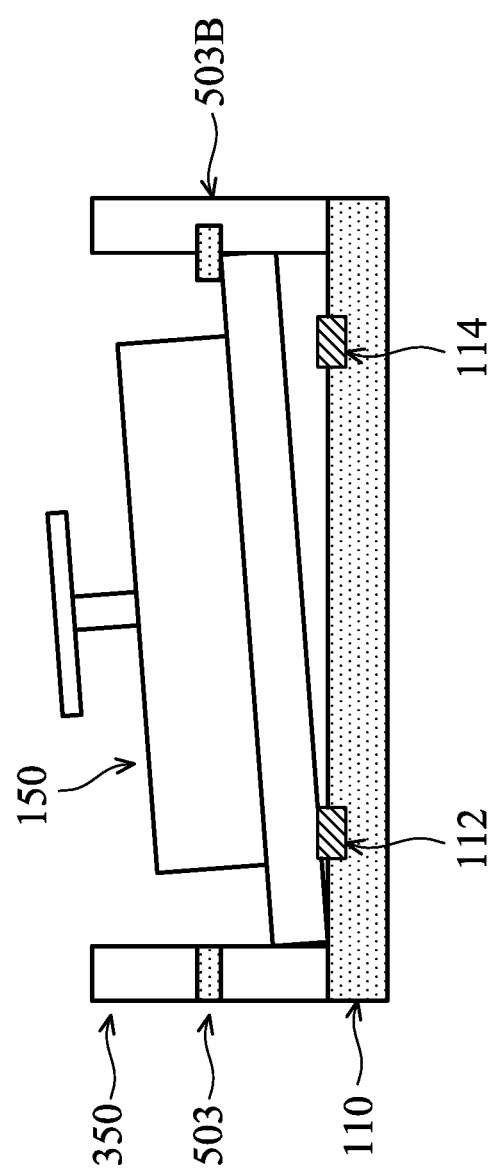

FIG. 18B shows that the mask pod 150 is being lifted up from the movable base 110 in a titled position (e.g., non-perpendicular direction). The tiling of the mask pod 150 in FIG. 18B is exaggerated for illustration purpose. For simplicity, the control unit 180 and its coupling with the sensors 112/114 and the locking devices 503 are not shown in FIGS. 18B-21B, with the understanding that the control unit 180 and the coupling between the control unit 180 and the sensors and the locking devices are still present.

In FIG. 18B, the right side of the mask pod 150 is lifted up while the left side of the mask pod 150 is still touching the movable base 110 and the sensor 112. As a result, the output of the sensor 112 is larger than the output of the sensor 114, and the difference between the outputs of the sensors 112 and 114 may be larger than the pre-determined threshold. In some embodiments, the control unit 180 determines that a non-perpendicular movement of the mask pod 150 occurred when the magnitude of the difference between the outputs of the sensors 112 and 114 is larger than the pre-determined threshold.

In response to the detection that the mask pod 150 is moving up in a non-perpendicular direction, the control unit 180 triggers deployment of one or more locking devices 503. The locking device 503, upon being deployed, protrudes into the smart load port and stops the non-perpendicular movement of the mask pod 150. Alarm signals such as lights or alarm sound may be triggered to warn the operator of the situation, so that actions can be taken to rectify the situation. Both locking devices 503A and 503B are deployed to stop the mask pod 150 in some embodiments. In other embodiments, the control unit 180 determines which side (e.g., left side or right side) of the mask pod 150 is tilting up based on the outputs of the sensors 112 and 114, and deploys one locking device 503, instead of two locking devices 503, to stop the mask pod 150. For example, in the illustrated example, the right side sensor 114 has a smaller output value (pressure value). Therefore, the control unit 180 determines that the right side of the mask pod 150 is tilting up, and thus, triggers deployment of the locking device 503B on the right side to stop the mask pod 150.

FIGS. 19A and 19B illustrates a method to prevent non-perpendicular movement of the mask pod 150 during the unloading process using smart load ports in accordance with another embodiment. The smart load port illustrated in FIGS. 19A and 19B is similar to that illustrated in FIGS. 18A and 18B, but with different sensors 112 and 114. In particular, the sensors 112 and 114 in FIGS. 19A and 19B are sensors configured to measure a distance between a sensor and the mask pod 150, e.g., the distance between the sensor and the bottom surface of the mask pod 150 directly above the sensor. For example, the sensors 112 and 114 may be ranger finders such as laser ranger finders or ultrasonic range finders.

In some embodiments, the sensor 112 (or 114) transmits a signal (e.g., laser signal or ultrasonic signal) toward the mask pod 150, receives the signal reflected by the mask pod 150, and measures the round trip time for the transmitted signal to bounce back to the sensor 112 (or 114). The distance between the sensor 112 (or 114) and the mask pod 150 can be determined by the round trip time (or half of it) and the speed of transmission of the transmitted signal. When the mask pod 150 is lying flat on the movable base 110, the measured distances from both sensors 112 and 114 are substantially equal. A pre-determined threshold for the differences between the output of the sensors 112 and 114 may be determined to account for factors such as sensitivity differences between the sensors, and to reduce false alarm. Details regarding the pre-determined threshold may be similar to those discussed above with reference to FIG. 18A, thus are not repeated. In some embodiments, the control unit 180 determines that the mask pod 150 is in a flat position when the magnitude of the difference between the outputs of the sensors 112/114 is within the pre-determined threshold.

Referring to FIG. 19B, when the mask pod 150 is being lifted up in a non-straight direction, the bottom surface of the mask pod 150 is titled. In the illustrated example, the output (e.g., distance value) of the sensor 114 on the right side is larger than the output of the sensor 112 on the right side. In some embodiment, the control unit 180 determines that a non-perpendicular movement of the mask pod 150 happened when the magnitude of the difference between the outputs of the sensors 112 and 114 is larger than the pre-determined threshold. In some embodiments, both locking devices 503A and 503B are deployed in response to the detection of the non-perpendicular movement of the mask pod 150. In other embodiments, one locking device (e.g., 503B) instead of two locking devices (e.g., 503A and 503B) are deployed to stop the side of the mask pod 150 that is tilting up.

Figure 20A:
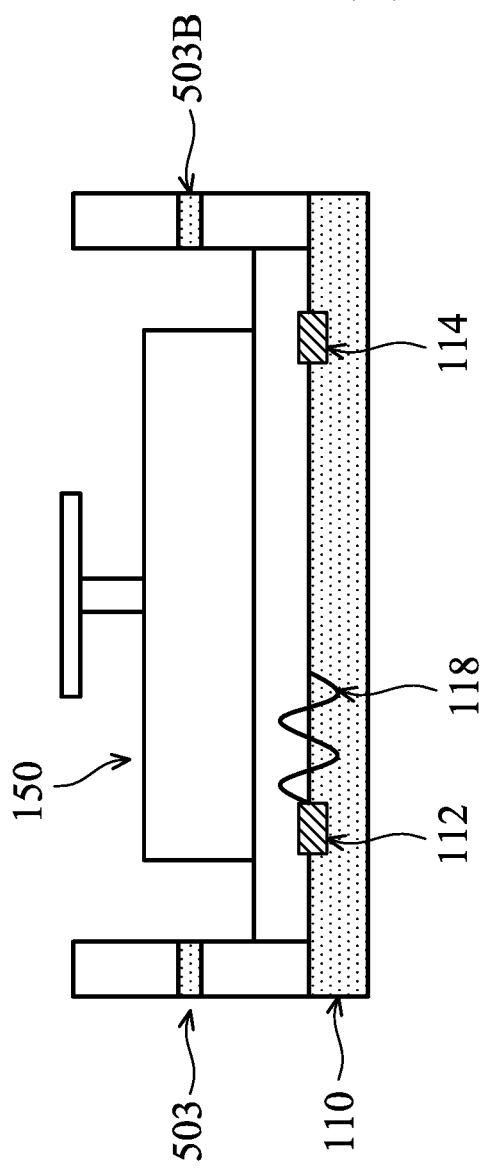
FIGS. 20A and 20B are cross-sectional views illustrating a method for detecting an abnormal condition of the mask pod using a smart load port, in accordance with some embodiments.
Figure 20B:
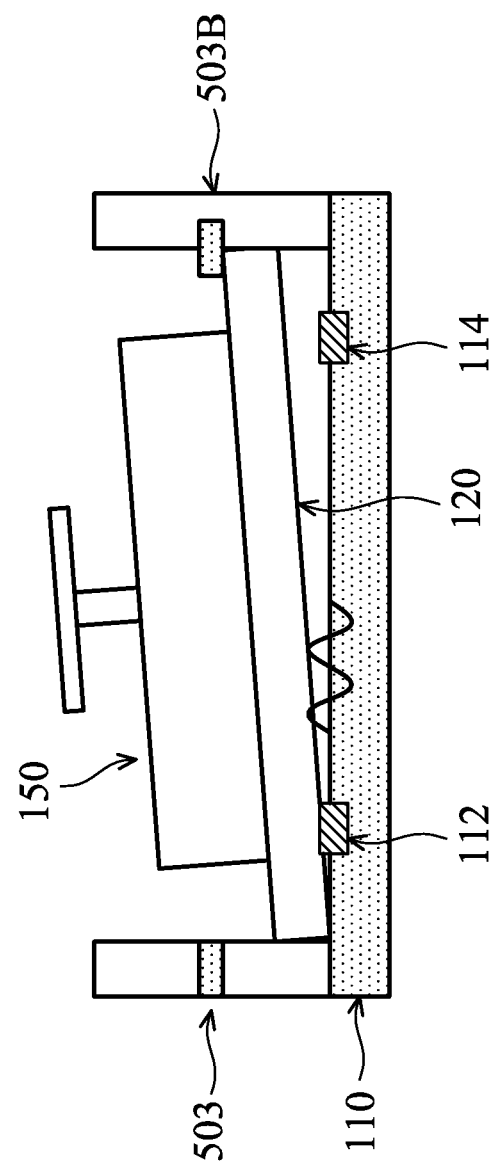

FIGS. 20A and 20B illustrates a method to prevent non-perpendicular movement of the mask pod 150 during the unloading process using smart load ports in accordance with another embodiment. The smart load port illustrated in FIGS. 20A and 20B is similar to that illustrated in FIGS. 18A and 18B, but with different sensors 112 and 114. In particular, the sensors 112 and 114 in FIGS. 20A and 20B are a pair of sensors that are configured to measure a travel time between the sensors 112 and 114 by a transmitted signal. For example, the sensor 112 may be an acoustic transmitter, and the sensor 114 may be an acoustic receiver, or vice versa.

In some embodiments, the control unit 180 calculates the travel time between the moment an acoustic signal 118 is transmitted by the acoustic transmitter (e.g., sensor 112) and the moment the transmitted acoustic signal arrives at the acoustic receiver (e.g., sensor 114). The acoustic signal travels along the interface between the mask pod 150 and the movable base 110, in some embodiments. Note that the speed of sound varies in different media. Since the distance between the sensors 112 and 114 is fixed, and the materials of the mask pod 150 and the movable base 110 are known, the travel time $T_1$ when the mask pod 150 is lying flat on the movable base 110 can be calculated or measured.

Referring to FIG. 20B, when the mask pod 150 is lifted up and tilted, e.g., with one side of the mask pod 150 still touching the movable base 110, the path through which the acoustic wave travels includes some air gap. Since the speed of sound is much slower in the air than in a solid material, the travel time $T_2$, when the mask pod 150 is tilted as illustrated in FIG. 20B, is larger than the travel time $T_1$. The increased travel time $T_2$, however, is smaller than a travel time $T_3$, when the mask pod 150 is lifted up in a straight upward direction (see 115 in FIG. 3) and just off the movable base 110, in which case the path through which the acoustic wave travels includes more air gap. The travel time $T_3$ can be determined, e.g., heuristically through measurements and experiments. Therefore, a travel time $T_2$ that is larger than $T_1$ but smaller than $T_3$ may be used for detecting the condition that the mask pad 150 is being lifted up and tilted.

In some embodiments, the control unit 180 calculates the difference between $T_2$ and $T_1$, and compares the calculated difference with a pre-determined threshold. The pre-determined threshold may be determined, e.g., heuristically through measurements and experiments. The pre-determined threshold may account for factors such as sensor sensitivity, and may be used to reduce false alarm (e.g., false detection of the tiling of the mask pod 150). In some embodiments, when the magnitude of the calculated difference (e.g., $T_2-T_1$) is smaller than the pre-determined threshold, the control unit 180 determines that the mask pod 150 is in a flat position as illustrated in FIG. 20A. In some embodiments, when the magnitude of the calculated difference is larger than the pre-determined threshold, and when $T_2$ is smaller than $T_3$, the control unit 180 determines that a tilting (e.g., a non-perpendicular movement) of the mask pod 150 is detected, and in response to the detection of the tilting, the control unit 180 deploys the locking devices 503 to stop the mask pod 150 from going up further. In some embodiments, once the tilting of the mask pod 150 is initially detected, the control unit 180 waits for a predetermined amount of time and repeats the operation described above for detecting the titling of the mask pod 150, and if titling of the mask pod 150 is detected again, the control unit 180 deploys the locking device 503. The delayed detection described above may further reduce the false alarm rate. Once detection of the tilting of the mask pad 150 is confirmed, warning signals such as lights or alarm sound may be generated to alert the operator, so that actions may be taken to rectify the situation. In some embodiments, both locking devices 503A and 503B are deployed in response to the detection of the non-perpendicular movement of the mask pod 150.

Figure 21A:
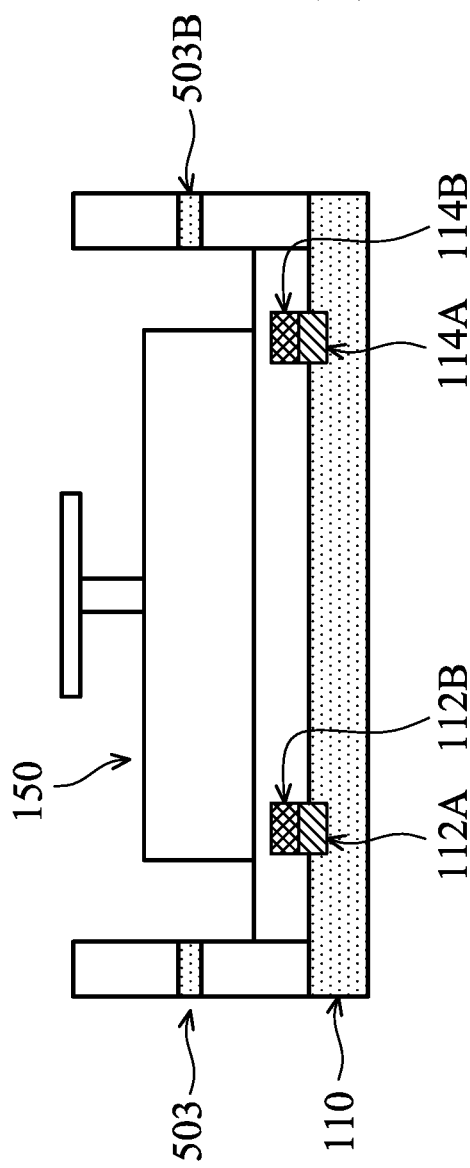
FIGS. 21A and 21B are cross-sectional views illustrating a method for detecting an abnormal condition of the mask pod using a smart load port, in accordance with some embodiments.
Figure 21B:
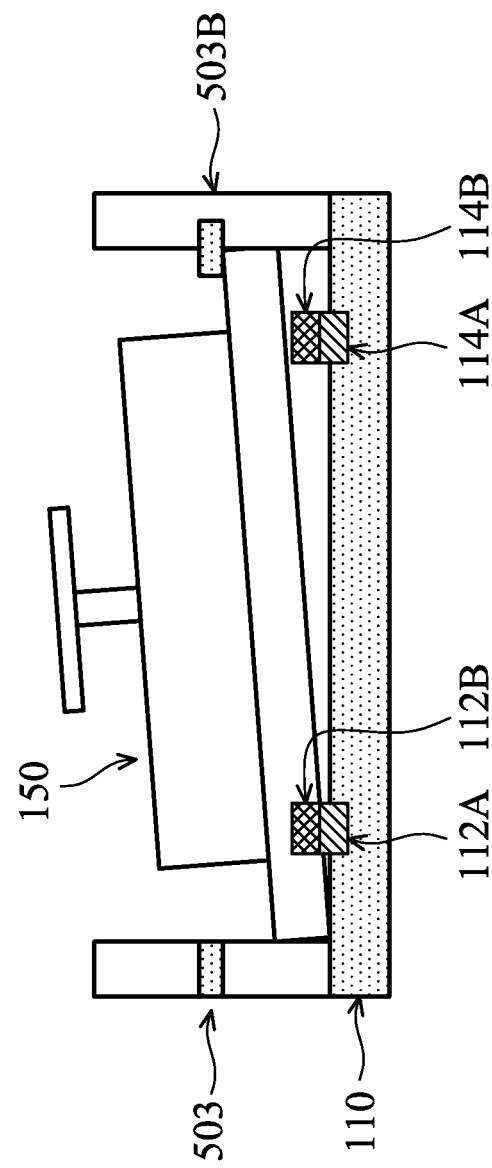

FIGS. 21A and 21B illustrates a method to prevent non-perpendicular movement of the mask pod 150 during the unloading process using smart load ports in accordance with another embodiment. The smart load port illustrated in FIGS. 21A and 21B is similar to that illustrated in FIGS. 18A and 18B, but with different sensors. In particular, the sensors in FIGS. 20A and 20B include a first pair of sensors 112A/112B and a second pair of sensor 114A/114B that are configured to measure a parameter that is adjustable (e.g., affected) by pressure. For example, the first pair of sensors 112A/112B and the second pair of sensors 114A/114B may be current sensors. As illustrated in FIG. 21A, each pair of sensors (e.g., 112A/112B) are stacked together and disposed over the upper surface of the movable base 110. In some embodiments, each pair of sensors (e.g., 112A/112B) include two electrodes that are in contact with each other. As the pressure applied on the two electrodes change, the resistance between the two electrodes changes, which results in a change in the current flowing through the electrodes. For example, when the pressure increases, the two electrodes are pressed tighter together, resulting in a smaller resistance and larger current, and vice versa. The current flowing through the electrodes is measured and becomes the output of the pair of sensors.

Referring to FIG. 21A, when the mask pod 150 is lying flat on the movable base 110, the measured current from the first pair of sensors 112A/112B and the second pair of sensors 114A/114B are substantially equal. A pre-determined threshold for the differences between the output of the first pair of sensors 112A/112B and the output of the second pair of sensors 114A/114B may be determined to account for factors such as sensitivity differences between the sensors, and to reduce false alarm. Details regarding the pre-determined threshold may be similar to those discussed above with reference to FIG. 18A, thus are not repeated. In some embodiments, the control unit 180 determines that the mask pod 150 is in a flat position when the magnitude of the difference between the outputs of first pair of sensors 112A/112B and the output of the second pair of sensors 114A/114B is within the pre-determined threshold.

Referring to FIG. 21B, when the mask pod 150 is being lifted up in a non-straight direction, the bottom surface of the mask pod 150 is titled. In the illustrated example, the output (e.g., current value) of the second pair of sensors 114A/114B on the right side is smaller than the output of the first pair of sensors 112A/112B on the left side, due to less pressure on the second pair of sensors 114A/114B. In some embodiment, the control unit 180 determines that a non-perpendicular movement of the mask pod 150 happened when the magnitude of the difference between the outputs of the first pair of sensors 112A/112B and the second pair of sensors 114A/114B is larger than the pre-determined threshold. In some embodiments, both locking devices 503A and 503B are deployed in response to the detection of the non-perpendicular movement of the mask pod 150. In other embodiments, one locking device (e.g., 503B) instead of two locking devices (e.g., 503A and 503B) is deployed to stop the side of the mask pod 150 that is tilting up from moving upward.

In some embodiments, the first pair of sensors 112A/112B and the second pair of sensors 114A/114B may be magnetic sensors, air flow sensors, water flow sensor, or the like. For example, a pipe with air flow or water flow inside may be connected or coupled to a pair of sensors (e.g., 112A/112B, or 114A/114B). The pressure from the weight of the mask pod 150 changes the air flow rate or water flow rate inside the pipe, which flow rate is then measured by the pair of sensors. As another example, the pressure from the weight of the mask pod 150 may change a current value and/or a physical dimension of an electromagnet coupled to the sensors, thus resulting in a change of the magnetic field of the electromagnet. The magnetic field is measured by the pair of sensors. When the mask pod 150 is titled, the first pair of sensors 112A/112B and the second pair of sensors 114A/114B produce different measured values, and the difference between the measured values can be used to detect the non-perpendicular movement of the mask pod 150.

Figure 22:
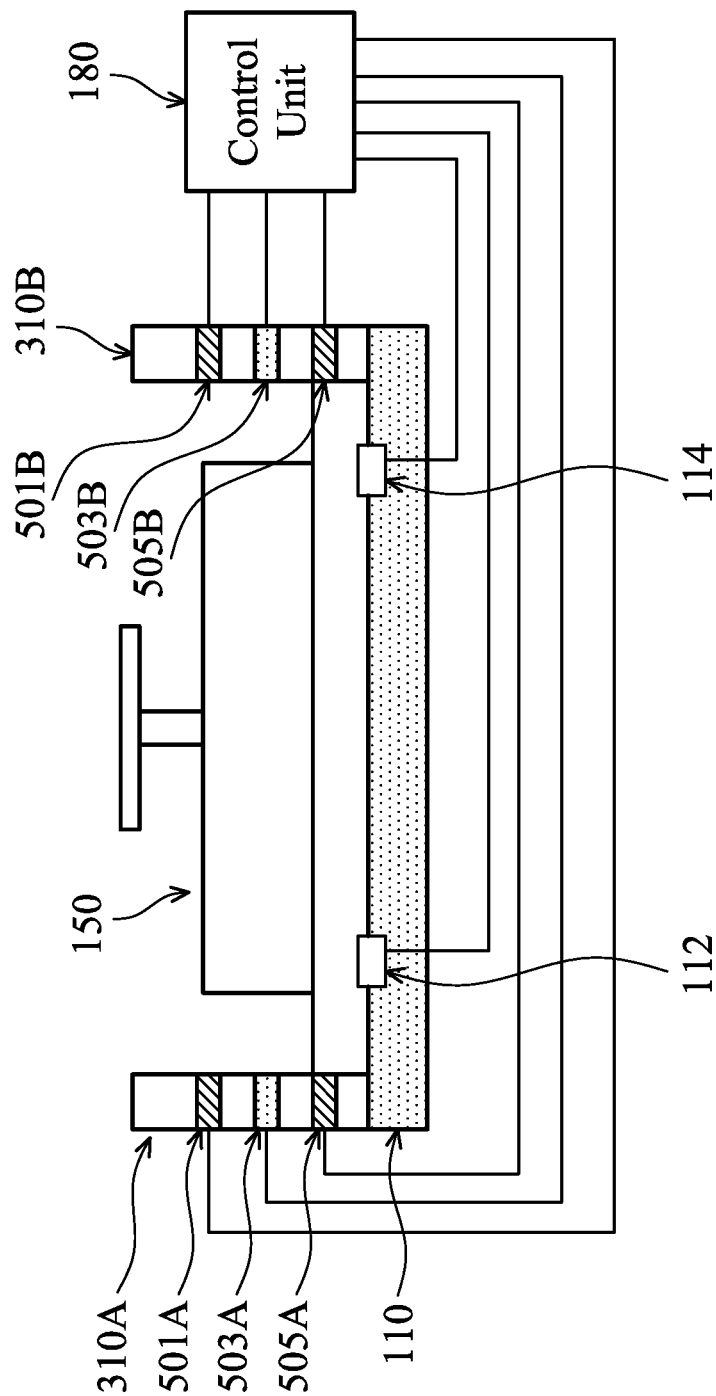
FIG. 22 illustrates the cross-sectional view of a load port having sensors in both the load port supporter and on the upper surface of a base of the load port, in accordance with some embodiments.

Variations and modifications to the disclosed embodiments are possible. For example, while two sensors (e.g., 501A and 505A in FIG. 12) are illustrated for each load port supporter (e.g., 310A in FIG. 12), more than two sensors may be used. As another example, the method for detecting abnormal condition discussed with reference to FIGS. 12-15 may be combined with the method for detecting non-perpendicular movement of the mask pad 150 discussed with reference to FIGS. 18A-21B, as illustrated in FIG. 22. In the embodiment of FIG. 22, sensors 501/505, locking devices 503, and control unit 180 are similar to the sensors 501/505, the locking device 503, and the control unit 180 in FIG. 12, respectively, and sensors 112 and 114 are similar to the sensors 112 and 114 in FIGS. 18A-21B. The control unit 180 in FIG. 22 detects abnormal conditions of the mask pod 150 using outputs from the sensors 501, 505, 112 and 114, and deploys the locking device(s) 503 in response to the detection of an abnormal condition of the mask pod. These and other variations and modifications are fully intended to be included within the scope of the present disclosure.

Figure 23B:
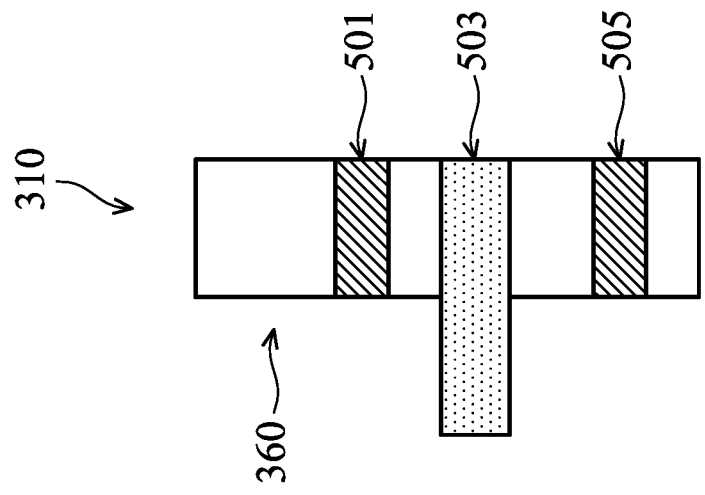
FIGS. 23A-23B illustrate a design for locking devices used in the smart load port, in accordance with some embodiments.
Figure 23A:
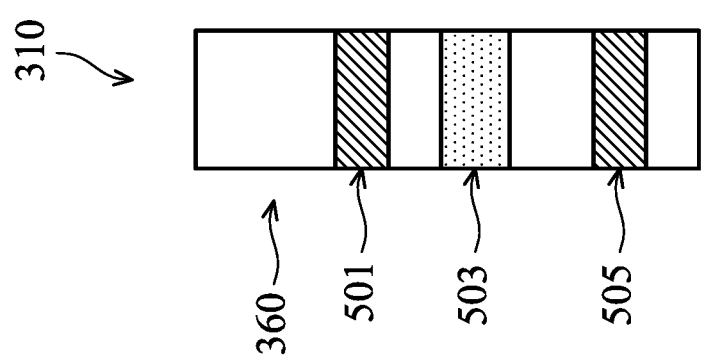

FIGS. 23A and 23B illustrate an embodiment of the locking device 503. In particular, FIG. 23A shows the locking device 503 in inactive mode, and FIG. 23B shows the locking device 503 in active mode (e.g., being deployed). When deployed, the locking device 503 extends out horizontally. For example, the locking device 503 may have a telescope structure and may be collapsed when not activated. When activated, the locking device 503 telescopes out to limit (e.g., block) the movement of the mask pod 150.

Figure 24B:
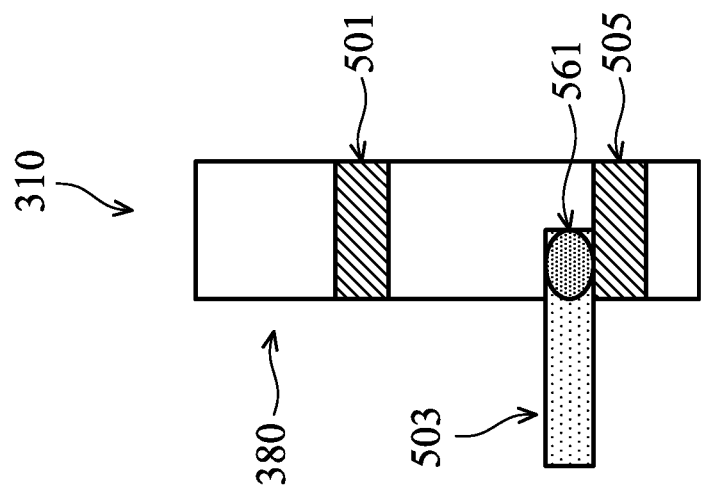
FIGS. 24A-24B illustrate a design for locking devices used in the smart load port, in accordance with some embodiments.
Figure 24A:
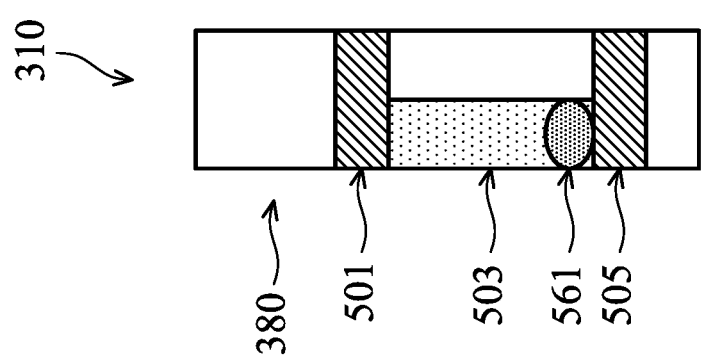

FIGS. 24A and 24B illustrate another embodiment of the locking device 503. In particular, FIG. 24A shows the locking device 503 in inactive mode, and FIG. 24B shows the locking device 503 in active mode (e.g., being deployed). The locking device 503 in FIGS. 24A and 24B has an axis 561, around which the locking device 503 can rotate. When not activated, the locking device 503 rotates back into the load port supporter 380. When activated, the locking device 503 rotates out of the load port supporter 380 and locks into position to limit (e.g., stop) the movement of the mask pod 150.

Embodiments may have various advantages. The load port supporter (e.g., 210 in FIGS. 4 and 310 in FIG. 7) increases the effective height of the load port, reduces the lateral movement of the mask pod, and reduces the chance of the reticle getting out of the load port and being damaged. The smart load port design, with sensors embedded, may detect abnormal conditions (e.g., separation of the upper mask pod from the lower mask pod, or non-perpendicular movement of the mask pod) of the mask pod. The built-in locking devices in the load port supporters may be deployed in response to the detection of the abnormal condition to limit the movement of the mask pod, which may prevent or reduce the chance of the reticle getting damaged.

Figure 25:
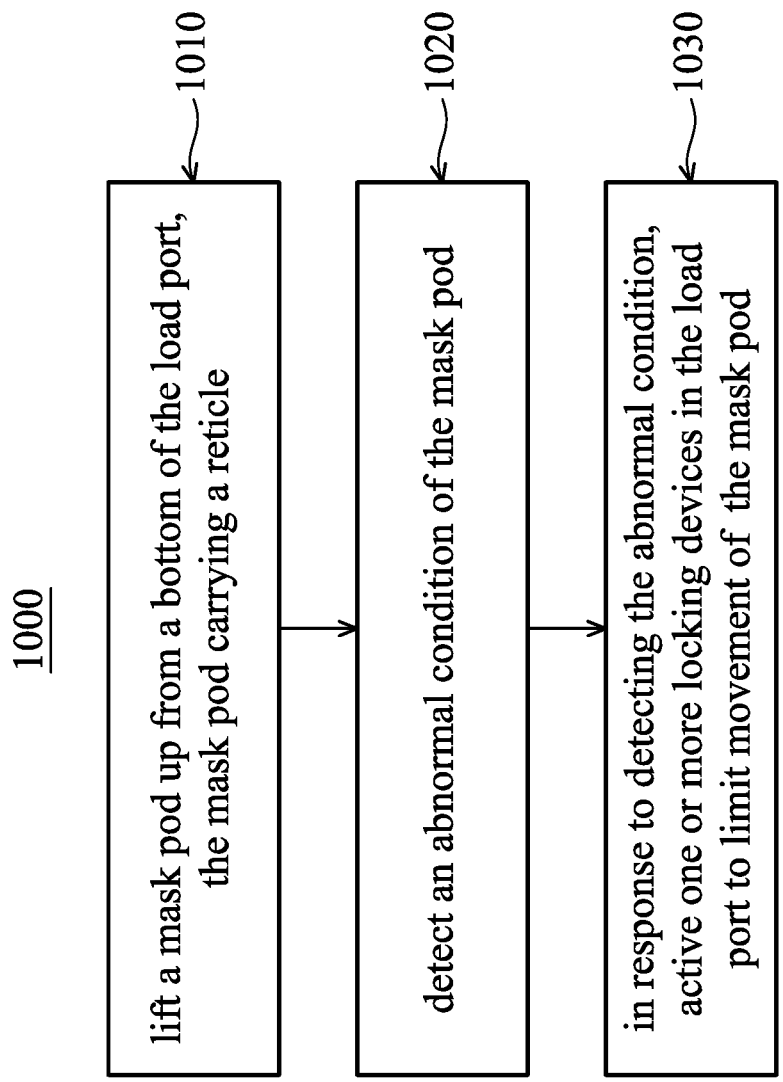
FIG. 25 is a flow chart of a method for removing a mask pod from a load port, in accordance with some embodiments.

FIG. 25 illustrates a flow chart of a method of operating a load port used in photolithography processing, in accordance with some embodiments. It should be understood that the embodiment method shown in FIG. 25 is merely an example of many possible embodiment methods. One of ordinary skill in the art would recognize many variations, alternatives, and modifications. For example, various steps as illustrated in FIG. 25 may be added, removed, replaced, rearranged and repeated Referring to FIG. 25, at step 1010, a mask pod is lifted up from a bottom of the load port, the mask pod carrying a reticle. At step 1020, an abnormal condition of the mask pod is detected. At step 1030, in response to detecting the abnormal condition, one or more locking devices are activated in the load port to limit movement of the mask pod.

In an embodiment, an apparatus configured to load or unload a mask pod includes a first load port supporter; and a second load port supporter spaced apart from the first load port supporter, where each of the first load port supporter and the second load port supporter includes at least portions of an L-shaped rectangular prism, where the first load port supporter and the second load port supporter are disposed diagonally around a rectangular area, where first inner sidewalls of the first load port supporter and second inner sidewalls of the second load port supporter delimit boundaries of the rectangular area, and where a first width of the rectangular area is equal to a second width of the mask pod, and a first length of the rectangular area is equal to a second length of the mask pod. In an embodiment, the apparatus further includes a load port, where the first load port supporter and the second load port supporter are attached to a first upper corner of the load port and a second upper corner of the load port, respectively, where the first upper corner and the second upper corner are two diagonal corners of the load port. In an embodiment, inner sidewalls of the load port are flush with respective first inner sidewalls of the first load port supporter and flush with respective second inner sidewalls of the second load port supporter. In an embodiment, the load port has chamfers between an upper surface of the load port and inner sidewalls of the load port, where the chamfers form a first angle with the upper surface of the load port, where the first load port supporter has a first bottom extension, where a slanted surface of the first bottom extension forms a second angle with a bottom surface of the first load port supporter, where the first angle is equal to the second angle. In an embodiment, the first load port supporter has chamfers between an upper surface of the first load port supporter and the first inner sidewalls, and the second load port supporter has chamfers between an upper surface of the second load port supporter and the second inner sidewalls. In an embodiment, the apparatus further includes a first pair of optical sensors including a first optical transmitter and a first optical receiver, the first pair of optical sensors being disposed in a first vertical location of the first load port supporter and a first vertical location the second load port supporter, respectively; a second pair of optical sensors includes a second optical transmitter and a second optical receiver, the second pair of optical sensors being disposed in a second vertical location of the first load port supporter and a second vertical location the second load port supporter, respectively; and a pair of locking devices comprising a first locking device and a second locking device, the pair of locking devices being disposed in a third vertical location of the first load port supporter and a third vertical location of the second load port supporter, respectively, where the pair of locking devices are between the first pair of optical sensor and the second pair of optical sensors. In an embodiment, the apparatus further includes a control unit coupled to the first pair of optical sensors, the second pair of optical sensors, and the pair of locking devices, where the control unit is configured to: based on an output of the first pair of optical sensors and an output of the second pair of optical sensors, detect separation of an upper mask pod of the mask pod from a lower mask pod of the mask pod while the mask pod is being unloaded; and in response to detecting the separation of the upper mask pod from the lower mask pod, activate the pair of locking devices to limit movement of the lower mask pod. In an embodiment, the first load port supporter and the second load port supporter have locking devices, where the apparatus further includes: a movable base under the first load port supporter and under the second load port supporter; a plurality of sensors on an upper surface of the movable base; and a control unit coupled to the plurality of sensors and the locking devices, where the control unit is configured to: based on outputs of the plurality of sensors, detect tilting of the mask pod during unloading of the mask pod; and in response to detecting titling of the mask pod, activate at least one of locking devices to limit movement of the mask pod. In an embodiment, the plurality of sensors include sensors selected from the group consisting essentially of pressure sensor, ranger finders, acoustic sensors, current sensors, magnetic sensors, air flow sensors, and liquid flow sensors. In an embodiment, the plurality of sensors comprises a first sensor and a second sensor, where the control unit is configured to: calculate a difference between a first output of the first sensor and a second output of the second sensor; compare a magnitude of the calculated different with a pre-determined threshold; and determine that titling of the mask pod is detected when the magnitude of the calculated difference is larger than the pre-determined threshold. In an embodiment, the plurality of sensors includes an acoustic transmitter and an acoustic receiver that are configured to measure a traveling time of an acoustic wave between the acoustic transmitter and the acoustic receiver, wherein the control unit is configured to: calculate a difference between the measured traveling time and an expected traveling time; compare a magnitude of the calculated difference with a pre-determined threshold; and determine that tilting of the mask pod is detected when the magnitude of the calculated difference is larger than the pre-determined threshold.

In an embodiment, a load port for loading and unloading a mask pod includes a first load port supporter having a shape of a first L-shaped rectangular prism; and a second load port supporter having a shape of a second L-shaped rectangular prism, where in a plan view, a first inner sidewall of the first load port supporter, a second inner sidewall of the first load port supporter, a first inner sidewall of the second load port supporter, and a second inner sidewall of the second load port supporter define four different sides of a rectangle, where a dimension of the rectangle is the same as a dimension of the mask pod; and optical sensors and locking devices embedded in the load port. In an embodiment, the first load port supporter has beveled edges connecting an upper surface thereof and the first inner sidewall and the second inner sidewall thereof. In an embodiment, a bottom surface of the first load port supporter and a bottom surface of the second load port supporter are disposed in a first plane, where the optical sensors and the locking devices include: a first optical transmitter in the first load port supporter; a first optical receiver in the second load port supporter, where the first optical transmitter and the first optical receiver are a first distance away from the first plane; a second optical transmitter in a first one of the first load port supporter and the second load port supporter; a second optical receiver in a second one of the first load port supporter and the second load port supporter, where the second optical transmitter and the second optical receiver are a second distance away from the first plane, the second distance being smaller than the first distance; a first locking device in the first load port supporter; and a second locking device in the second load port supporter, where the first locking device and the second locking device are a third distance away from the first plane, where the third distance is larger than the second distance but smaller than the first distance. In an embodiment, the load port further includes a control unit coupled to a first output of the first optical receiver and coupled to a second output of the second optical receiver, where the control unit is configured to, during unloading of a mask pod from the load port: detect that an upper mask pod of the mask pod is detached from a lower mask pod of the mask pod; and in response to detecting that the upper mask pod is detached from the lower mask pod, deploy at least one of the first locking device and the second locking device to limit movement of the lower mask pod. In an embodiment, the load port further includes: a first locking device in the first load port supporter; a second locking device in the second load port supporter; a movable base having an upper surface that contacts the first load port supporter and the second load port supporter during unloading of the mask pod; and a first sensor and a second sensor on the upper surface of the movable base, where the first sensor and the second sensor are configured to detect an uneven uplifting of the mask pod.

In an embodiment, a method of operating a load port used in photolithography processing includes: lifting a mask pod up from a bottom of the load port, the mask pod carrying a reticle; detecting an abnormal condition of the mask pod; and in response to detecting the abnormal condition, activating one or more locking devices of the load port to limit movement of the mask pod. In an embodiment, the abnormal condition includes a separation of an upper mask pod of the mask pod from a lower mask pod of the mask pod, where the load port includes a first pair of optical sensors in sidewalls of the load port, where the load port includes a second pair of optical sensors in the sidewalls of the load port and over the first pair of optical sensors, where detecting the abnormal condition uses an output from the first pair of optical sensors and an output from the second pair of optical sensors. In an embodiment, the abnormal condition includes an uneven uplifting of the mask pod, where the load port includes a first sensor and a second sensor that are on an upper surface of a base of the load port, where detecting the abnormal condition includes calculating a difference between a first output of the first sensor and a second output of a second sensor, and comparing a magnitude of the difference to a pre-determined threshold. In an embodiment, the load port includes: at least two pairs of optical sensors disposed along a vertical direction of the load port; at least two sensors disposed along a horizontal direction of the load port; and a control unit, where the control unit utilizes outputs from the at least two pairs of optical sensors and the at least two sensors to detect the abnormal condition of the mask pod.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus configured to load or unload a mask pod, the apparatus comprising:
a load port having a rectangular ring shape, wherein inner sidewalls of the load port define an opening that extends through the load port; and
a first load port supporter attached to a first corner of the load port, wherein the first load port supporter comprises at least portions of an L-shaped rectangular prism and protrudes above an upper surface of the load port.

2. The apparatus of claim 1, wherein the load port has chamfers between the upper surface of the load port and the inner sidewalls of the load port.

3. The apparatus of claim 2, wherein the inner sidewalls of the load port are flush with respective inner sidewalls of the first load port supporter.

4. The apparatus of claim 2, wherein the chamfers of the load port form a first angle with the upper surface of the load port, wherein a bottom surface of the first load port supporter contacts the upper surface of the load port, wherein the first load port supporter has a first bottom extension, and a slanted surface of the first bottom extension forms a second angle with the bottom surface of the first load port supporter, wherein the first angle is the same as the second angle.

5. The apparatus of claim 1, further comprising a second load port supporter attached to a second corner of the load port, wherein the first corner and the second corner are two diagonal corners of the load port.

6. The apparatus of claim 1, wherein the first load port supporter comprises a first material with a first hardness, and the load port comprises a second material with a second hardness, wherein the first hardness is larger than the second hardness.

7. The apparatus of claim 1, wherein the first load port supporter comprises an optical sensor.

8. The apparatus of claim 7, wherein the first load port supporter further comprises a locking device.

9. The apparatus of claim 8, wherein the locking device is configured to protrude into the opening when activated.

10. The apparatus of claim 1, further comprising a movable base under the load port, wherein the movable base comprises at least two sensors at an upper surface of the movable base facing the load port.

11. The apparatus of claim 10, wherein outputs of the two sensors are pressure-sensitive.

12. A method of operating a load port for semiconductor manufacturing, the method comprising:
lifting a mask pod up from a bottom of the load port, the mask pod carrying a reticle;
detecting an abnormal condition of the mask pod during lifting of the mask pod; and
in response to detecting the abnormal condition, limiting movement of the mask pod.

13. The method of claim 12, wherein limiting movement of the mask pod comprises activating a locking device of the load port to limit movement of the mask pod.

14. The method of claim 13, wherein the locking device protrudes into a space between opposing inner sidewalls of the load port when activated.

15. The method of claim 12, wherein the mask pod comprises an upper mask pod and a lower mask pod, wherein the abnormal condition comprises separation of the upper mask pod from the lower mask pod, wherein detecting the abnormal condition comprises:
monitoring outputs from two pairs of optional sensors embedded vertically in sidewalls of the load port; and
declaring the abnormal condition when the outputs from the two pairs of optional sensors are abnormal.

16. The method of claim 12, wherein the abnormal condition comprises an uneven uplifting of the mask pod, wherein detecting the abnormal condition comprises:
monitoring outputs from two sensor disposed at an upper surface of a movable base of the load port, wherein the mask pod is placed on the upper surface of the movable base before being lifted up;

calculating a difference between the outputs from the two sensors;

comparing the calculated difference with a pre-determined threshold; and declaring the abnormal condition when the calculated difference is above the pre-determined threshold.

17. A method of operating a load port for semiconductor manufacturing, the method comprising:

moving a mask pod along inner sidewalls of the load port from a bottom of the load port toward a top of the load port;

receiving, by a first optical receiver, a first optical signal transmitted by a first optical transmitter;

receiving, by a second optical receiver, a second optical signal transmitted by a second optical transmitter, wherein the first optical transmitter, the second optical transmitter, the first optical receiver, and the second optical receiver are embedded in the inner sidewalls of the load port, wherein the first optical transmitter and the first optical receiver are disposed further from the bottom of the load port than the second optical transmitter and the second optical receiver;

recording, at a plurality of time instants, first values of the first optical signal and second values of the second optical signal, wherein each one of the first values and a respective one of the second values define a state of the first and second optical receivers at a respective time instant; and detecting, by a control unit, an abnormal condition of the pod mask by detecting an abnormal state of the first and the second optical receivers.

18. The method of claim 17, further comprising:

in response to detecting the abnormal state, deploying, by the control unit, a locking device to limit movement of the mask pod.

19. The method of claim 17, further comprising:

analyzing, by the control unit, a sequence of the state of the first and second optical receivers; and reconstructing, by the control unit, how and when the abnormal condition occurs.

20. The method of claim 19, wherein the reconstructing comprises:

detecting, by the control unit, transitions in the sequence of the state of the first and second optical receivers; and determining, by the control unit, time instants of the transitions using time stamps of the recorded first values and the recorded second values.

* * * * *